US009437466B2

(12) United States Patent
Sakiya et al.

(10) Patent No.: US 9,437,466 B2
(45) Date of Patent: Sep. 6, 2016

(54) STORAGE CONTAINER, SHUTTER OPENING/CLOSING UNIT OF STORAGE CONTAINER, AND WAFER STOCKER USING STORAGE CONTAINER AND SHUTTER OPENING/CLOSING UNIT

(71) Applicant: RORZE CORPORATION, Fukuyama-shi, Hiroshima (JP)

(72) Inventors: Fumio Sakiya, Fukuyama (JP); Katsunori Sakata, Fukuyama (JP)

(73) Assignee: RORZE CORPORATION, Fukuyama-Shi, Hiroshima (JP)

( * ) Notice: Subject to any disclaimer, the term of this patent is extended or adjusted under 35 U.S.C. 154(b) by 0 days.

(21) Appl. No.: 14/513,979

(22) Filed: Oct. 14, 2014

(65) Prior Publication Data

US 2015/0030416 A1    Jan. 29, 2015

Related U.S. Application Data

(63) Continuation of application No. PCT/JP2013/060838, filed on Apr. 10, 2013.

(30) Foreign Application Priority Data

Apr. 16, 2012 (JP) ................................. 2012-093247

(51) Int. Cl.
*H01L 21/677* (2006.01)
*H01L 21/67* (2006.01)
(Continued)

(52) U.S. Cl.
CPC ...... *H01L 21/67742* (2013.01); *B25J 11/0095* (2013.01); *E05F 15/10* (2013.01);
(Continued)

(58) Field of Classification Search
CPC ............. H01L 21/673; H01L 21/6732; H01L 21/67346; H01L 21/6735; H01L 21/67389; H01L 21/67393; H01L 21/67763; H01L 21/67265; H01L 21/67383; H01L 21/67386; H01L 21/67769; H01L 21/67772
See application file for complete search history.

(56) References Cited

U.S. PATENT DOCUMENTS

| | | |
|---|---|---|
| 5,100,276 A | 3/1992 | Iwasaki et al. |
| 6,176,023 B1 | 1/2001 | Doche |

(Continued)

FOREIGN PATENT DOCUMENTS

| | | |
|---|---|---|
| CN | 101174574 A | 5/2008 |
| JP | 1994-034253 U | 5/1994 |

(Continued)

OTHER PUBLICATIONS

PCT, "International Search Report for International Application No. PCT/JP2013/060838".

(Continued)

*Primary Examiner* — Kaitlin Joerger
(74) *Attorney, Agent, or Firm* — Manabu Kanesaka

(57) ABSTRACT

Provided is a wafer stocker that can prevent the inflow of an external atmosphere, maintain a wafer storage space at a desired atmosphere with a relatively small amount of gas, and prevent dust from being attached to a wafer surface. A shutter portion, including multiple shield plates having the same height as an interval between shelf plates disposed in a storage container, is disposed with a slight space from a body portion, and by supplying clean gas into the storage container, a clean atmosphere of a higher pressure than an external environment is maintained, and a shutter portion is opened and closed by moving up and down the shield plate independently from the shelf plate that supports a wafer.

17 Claims, 16 Drawing Sheets

(51) Int. Cl.
*H01L 21/673* (2006.01)
*B25J 11/00* (2006.01)
*E05F 15/10* (2006.01)
*E05F 15/20* (2006.01)

(52) U.S. Cl.
CPC ..... *E05F15/2084* (2013.01); *H01L 21/67265* (2013.01); *H01L 21/67346* (2013.01); *H01L 21/67379* (2013.01); *H01L 21/67383* (2013.01); *H01L 21/67386* (2013.01); *H01L 21/67393* (2013.01); *H01L 21/67748* (2013.01); *H01L 21/67769* (2013.01); *H01L 21/67772* (2013.01); *H01L 21/67775* (2013.01)

(56) References Cited

U.S. PATENT DOCUMENTS

| | | | |
|---|---|---|---|
| 6,364,922 B1 | 4/2002 | Tanaka et al. | |
| 6,540,467 B1* | 4/2003 | Zohni | H01L 21/6732 206/710 |
| 6,770,109 B2 | 8/2004 | Tanaka et al. | |
| 6,835,039 B2* | 12/2004 | van den Berg | H01L 21/67098 414/217 |
| 7,015,492 B2* | 3/2006 | Garssen | H01L 21/67265 220/221 |
| 7,440,091 B2* | 10/2008 | Bagley | H01L 21/67265 356/237.2 |
| 7,663,129 B1* | 2/2010 | Lu | H01L 21/67265 250/223 R |
| 7,694,817 B2* | 4/2010 | Ikehata | B65D 85/48 206/454 |
| 8,302,637 B2 | 11/2012 | Okabe et al. | |
| 8,554,358 B2 | 10/2013 | Jager et al. | |
| 8,662,308 B2* | 3/2014 | Yoshizawa | H01L 21/673 206/454 |
| 9,054,144 B2* | 6/2015 | Burns | H01L 21/67376 |
| 9,144,901 B2* | 9/2015 | Yang | B25H 3/00 |
| 2002/0129707 A1 | 9/2002 | Tanaka et al. | |
| 2008/0156679 A1* | 7/2008 | Bonora | B65D 81/2076 206/320 |
| 2009/0035100 A1 | 2/2009 | Okabe et al. | |
| 2009/0297303 A1 | 12/2009 | Hyobu et al. | |
| 2010/0179681 A1 | 7/2010 | Jager et al. | |
| 2012/0027547 A1* | 2/2012 | Jager | H01L 21/6734 414/287 |

FOREIGN PATENT DOCUMENTS

| | | |
|---|---|---|
| JP | 2003-068841 A | 3/2003 |
| JP | 2005-259858 A | 9/2005 |
| JP | 2008-290862 A | 12/2008 |
| JP | 2009-038074 A | 2/2009 |
| WO | 2010/137556 A1 | 12/2010 |

OTHER PUBLICATIONS

Europe Patent Office, "Search Report for EP 13778995.4," Oct. 19, 2015.
Japan Patent Office, "Office Action for Japanese Patent Application No. 2014-511183," Dec. 4, 2015.
China Patent Office, Office Action for Chinese Patent Application No. 201380019946.6, Apr. 21, 2016.

* cited by examiner

STORAGE CONTAINER, SHUTTER OPENING/CLOSING UNIT OF STORAGE CONTAINER, AND WAFER STOCKER USING STORAGE CONTAINER AND SHUTTER OPENING/CLOSING UNIT

CROSS-REFERENCES TO RELATED APPLICATIONS

The present application is a continuation application of PCT International Application No. PCT/JP2013/060838 filed Apr. 10, 2013, and claims priority from Japanese Application No. 2012-093247 filed Apr. 16, 2012.

TECHNICAL FIELD

The present invention relates to a storage container, a shutter opening/closing unit of the storage container, and a wafer stocker using the storage container and the shutter opening/closing unit. The storage container, the shutter opening/closing unit, and the wafer stocker are used to temporarily store a wafer or a test wafer being processed in a semiconductor manufacturing process in which advanced particulate exclusion and chemical pollutant exclusion are required.

BACKGROUND ART

Precision electronic parts formed on a substrate such as a semiconductor wafer and a liquid crystal display board are sequentially subjected to various manufacturing processes and test processes such as photoresist application, thin film deposition, formation of an oxide film and a nitrification film, etching, and heat treatment, and are commercialized through a series of various processing steps. A substrate, a surface of which has been subjected to one processing step, is stored in a sealable clean container called FOUP (Front-Opening Unified Pod), and conveyed to the next step by conveying means in a factory. However, due to a difference in time required for the processing of each processing step, the standby time is required until the next processing step. At this time, the substrate is temporarily stored in a storage device called a stocker, and waits until the next processing starts. In the semiconductor manufacturing process, when a new processing step is introduced, a wafer for test called a test wafer is used for determining processing parameters to be actually used, in order to optimize the processing step.

In the related art, a standby semiconductor wafer or test wafer is stored in the FOUP and put on a shelf installed in a zone in which the degree of cleanliness is relatively high in a clean room. Recently, however, in order to minimize the footprint of a stocker in a semiconductor manufacturing factory, a wafer stocker has been required, instead of the FOUP, for storing a wafer. The wafer stocker is a container dedicated for storage, and can store wafers while minimizing the intervals between the wafers.

In Patent Literature 1, space saving is achieved in such a manner that storage rings, on which wafers are placed, are accumulated at intervals so as not to bring the wafer surfaces into contact with each other. Moreover, the upper surface and the bottom surface of each accumulated storage ring are covered with a cover, and a region for storing each wafer is isolated from an external environment. It is thus possible to maintain the inside of the region at an inert gas atmosphere such as nitrogen. The conveyance of the wafer into/out of each storage ring is performed by dedicated conveying means installed in the stocker. At the time of conveyance, a space (opening) accessible by the conveying means is formed by a drive mechanism (referred to as "opening means" below) that lifts each storage ring by a predetermined amount individually.

The wafer storage amount in a unit space has increased by the above-mentioned structure, but the following new problems have occurred. When a wafer stored in an accumulated storage ring is carried out or a wafer is carried into the storage ring, the storage ring to be accessed and a storage ring below it are lifted by the opening means up to a height at which a gripper of conveying means can be inserted. Then, when the access of the gripper ends, the lifted storage rings are returned to the original accumulation positions by the opening means. In this case, however, the following trouble occurs. That is, when the storage rings are lifted, the lifted storage rings and adjacent rings collide with each other, generating dust which contaminates wafers placed on the storage rings.

In addition, when a target storage ring and all the storage rings disposed above it are lifted by the opening means, the capacity of a wafer storage space formed by each storage ring and the upper and lower covers temporarily increases, and an atmosphere including dust is sucked into the storage space from an external environment. This prior art includes means for substituting an inert gas atmosphere for the inside of the storage space. However, since the opening area at the time of conveyance is large, the gas filled in the storage space diffuses outside in a short time, making it necessary to supply a large amount of inert gas every time the opening operation is performed. In addition, a natural oxide film is formed on a semiconductor wafer under processing by oxygen and vapor included in the air entering from the external environment, making the following processing incomplete and reducing a yield.

CITATION LIST

Patent Literature

Patent Literature 1: JP 2009-500256 W

SUMMARY OF INVENTION

Technical Problem

Therefore, an object of the present invention is to provide a wafer stocker that can prevent the inflow of an external atmosphere, maintain a wafer storage space at a desired atmosphere with a relatively small amount of gas and prevent dust from being attached to a wafer surface.

Solution to Problem

In order to solve the above-described problem, according to claim 1 of the present invention, there is provided a storage container including: a body portion that has an opening portion in one surface and has multiple shelf plates disposed at regular intervals in a vertical direction so as to support a tabular object to be stored internally, and a spacer that is disposed between the multiple shelf plates and maintains an interval between the vertically adjacent shelf plates; a cover member that covers a side surface and a top and a bottom other than the opening portion of the body portion; and a shutter portion that has multiple shield plates to cover the opening portion corresponding to the multiple shelf plates, and enables access to the object to be stored supported and stored in the body portion by moving up and down the shield plates separately from the shelf plates, wherein the body portion has a nozzle portion to supply clean gas internally, and the shutter portion is disposed at a minute space from the body portion so as to flow out the gas supplied from the nozzle portion to the outside by a proper quantity while maintaining an inner pressure of the body portion.

According to the storage container according to claim 1, since the body portion of the storage container and the shutter are disposed in a mutually non-contact state, dust is not generated due to friction. Moreover, since the inside of the body portion is maintained at a higher pressure than the external environment by gas supplied from the nozzle, dust from the outside and the air including vapor do not infiltrate.

The storage container according to claim 2 of the present invention has a feature that, in the storage container according to claim 1, the shelf plates are disposed at intervals accessible by a robot finger that holds the object to be stored.

According to the storage container according to claim 2, the conveyance of the object to be stored by a conveyance robot becomes possible.

The storage container according to claim 3 of the present invention has a feature that, in the storage container according to claim 1 or 2, each of the shield plates of the shutter has a height equal to the interval between the shelf plates, and is accumulated and disposed so as to be vertically movable individually.

According to the storage container according to claim 3, it is possible to form an opening accessible by a conveyance robot by raising the shutter by one stage. Moreover, since the shutter merely moves in the vertical direction, an external atmosphere including dust is not involved. In addition, since the shutter and the body portion are disposed at an interval, dust is not generated due to vertical motion.

The storage container according to claim 4 of the present invention has a feature that, in the storage container according to claims 1 to 3, each of the shield plates of the shutter is vertically movable in a surface restricted by a position restriction member.

According to the storage container according to claim 4, the shutter can prevent a positional gap when moving up and down by the position restriction member.

The storage container according to claim 5 of the present invention has a feature that, in the storage container according to claims 1 to 4, the body portion includes a detection window configured to transmit light emitted from an optical sensor that detects the presence of the object to be stored supported by the shelf plate.

According to the storage container according to claim 5, it is possible to detect the object to be stored in the container by the optical sensor without opening the shutter.

The storage container according to claim 6 of the present invention has a feature that, in the storage container according to claims 1 to 5, the flow rate of the gas supplied from the nozzle into the body portion can be switched between when each of the shield plates is opened and when each of the shield plates is closed.

According to the storage container according to claim 6, it is possible to maintain a clean atmosphere in the body portion when the shutter is opened.

The storage container according to claim 7 of the present invention has a feature that, in the storage container according to claims 1 to 6, a space between the shutter and the body portion forms a labyrinthine structure.

According to the storage container according to claim 7, since gas flows out through a channel of the labyrinthine shape, it becomes easy to maintain the positive pressure in the storage container.

The storage container according to claim 8 of the present invention has a feature that, in the storage container according to claims 1 to 7, the body portion has positioning members on an upper surface and a lower surface thereof, and is configured to be accumulated and disposed in a vertical direction.

According to the storage container according to claim 8, it is possible to easily accumulate the storage container while preventing a positional gap.

The shutter opening/closing unit according to claim 9 of the present invention is a shutter opening/closing unit that opens and closes the shutter included in the storage container according to claims 1 to 8, and has a feature of including a hook configured to be engaged with a notch portion formed in the shield plate, a shutter support mechanism, and a lift drive portion that moves up and down the shutter support mechanism in parallel to a direction in which the storage container is accumulated.

According to the shutter opening/closing unit according to claim 9, it is possible to open and close each shield plate of the storage container that is accumulated and disposed in the vertical direction by one shutter opening/closing unit.

The shutter opening/closing unit according to claim 10 has a feature that the optical sensor includes a pair of a light projecting portion and a light receiving portion, and is attached to the shutter shutter support mechanism.

According to the shutter opening/closing unit according to claim 10, two operations, i.e., the opening/closing of the shutter and the detection of the object to be stored in the storage container by the optical sensor become possible by the lift operation of one lift drive portion.

The wafer stocker according to claim 11 of the present invention has a feature of including a clean booth, a FOUP opener joined to an outer surface of the clean booth, one or two or more storage containers vertically accumulated and disposed in the clean booth, the shutter opening/closing unit, a wafer conveyance portion that conveys a wafer between the FOUP and the storage container, and a stocker control portion.

According to the wafer stocker according to claim 11, it is possible to provide a wafer stocker that does not generate dust from friction caused by the opening/closing of the shutter.

The wafer stocker according to claim 12 of the present invention has a feature that, in the wafer stocker according to claim 11, the stocker control portion has a function to adjust a flow rate of gas supplied into the storage container according to operation of opening and closing the shutter by the shutter opening/closing unit.

According to the wafer stocker according to claim 12, it is possible to suppress a change in an atmosphere in the storage container caused by the shutter opening/closing operation.

The wafer stocker according to claim 13 of the present invention has a feature of including, in the wafer stocker according to claim 11 or 12, a storage shelf formed by accumulating the storage containers in a vertical direction, a storage unit in which multiple storage shelves are disposed at equal intervals, a rotation drive portion that rotates and operates the storage unit, a shutter opening/closing unit disposed in a position adjacent to the storage unit, and the wafer conveyance portion that conveys the wafer between the FOUP and the storage container.

According to the wafer stocker according to claim 13, it is possible to increase the number of objects to be stored.

The wafer stocker according to claim 14 of the present invention has a feature that, in the wafer stocker according to claims 11 to 13, the storage unit includes a round placement table on which the multiple storage shelves are placed at equal intervals.

According to the wafer stocker according to claim 14, it is possible to dramatically increase the number of objects that can be stored in a stocker per unit area.

Advantageous Effects of Invention

According to the present invention, it is possible to prevent the inflow of an external atmosphere, maintain a wafer storage space at a desired atmosphere with a relatively small amount of gas, and prevent dust from being attached to a wafer surface.

DESCRIPTION OF EMBODIMENTS

Figure 1:
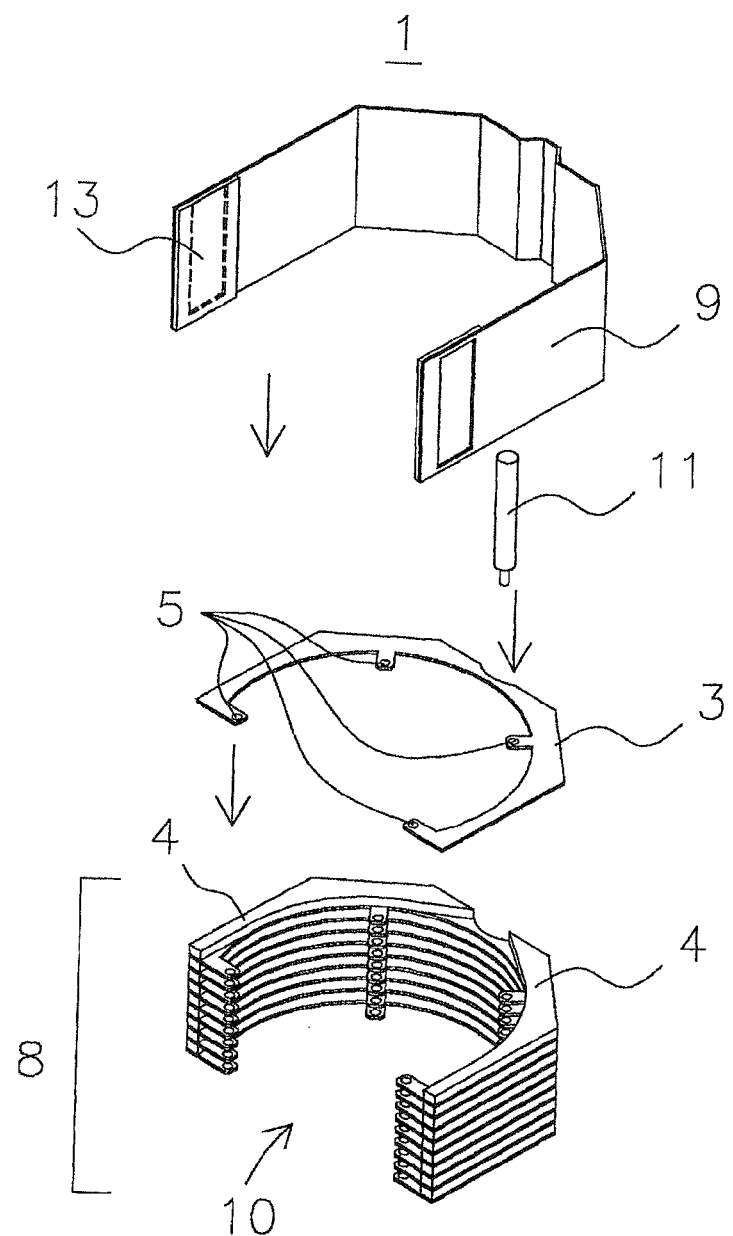
FIG. 1 is a perspective view illustrating each member forming a substrate storage container of the present invention.
Figure 2:
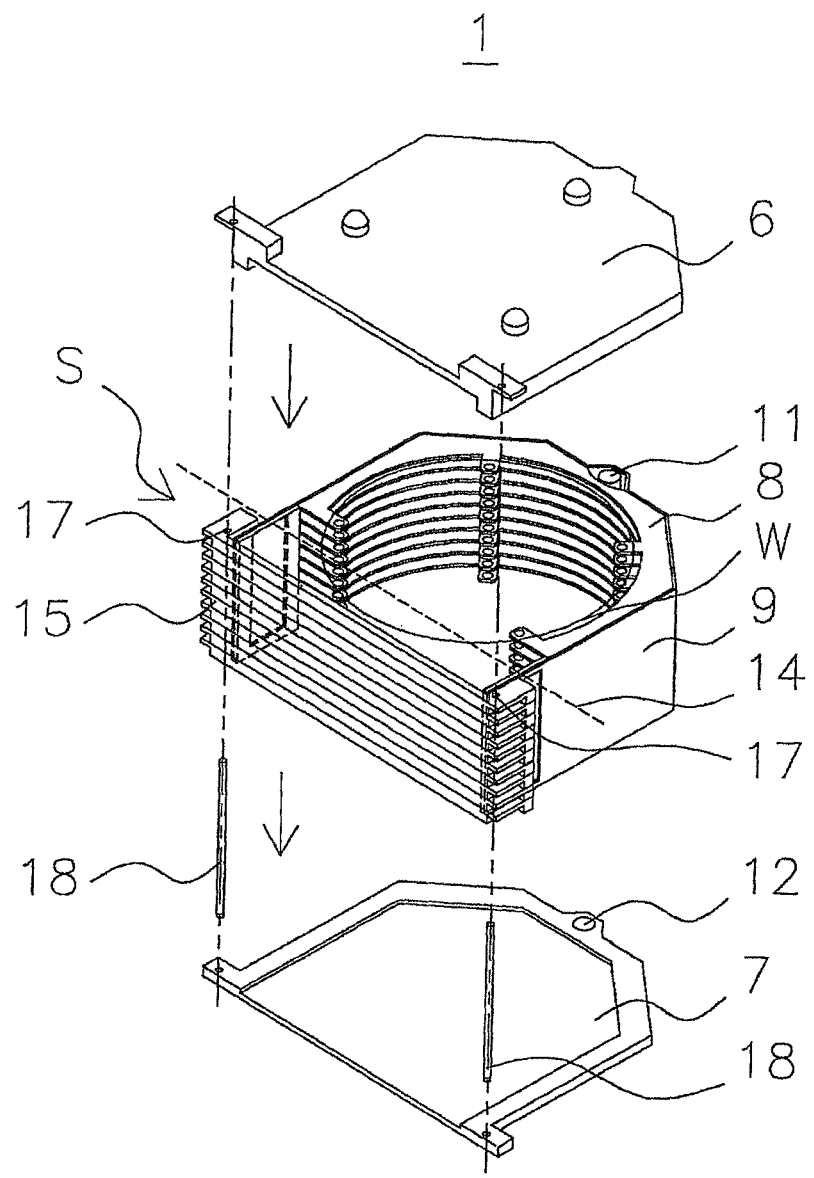
FIG. 2 is a perspective view illustrating a shutter and peripheral members in the substrate storage container of the present invention.

Next, embodiments of the present invention will be described in detail with reference to the drawings. FIG. 1 is an exploded perspective view illustrating members forming a substrate storage container 1 of the present invention, and FIG. 2 is an exploded perspective view illustrating the substrate storage container 1 and a shield plate 15. In the substrate storage container 1, multiple shelf plates 3, on which a substrate 2 is to be placed, are layered and fixed at regular intervals through spacers 4 so as to be parallel to each other in the vertical direction.

Note that in the case of the present embodiment described below, a semiconductor wafer W that is a tabular member is exemplified as the substrate 2 to be stored. Moreover, the vertical interval between the shelf plates 3 is set to 7 mm such that conveying means for holding and conveying the wafer W can access the inside of the substrate storage container 1 when the wafer W is stored in or extracted from the substrate storage container 1. The shelf plates 3 form a tray in which they are overlapped in a layered manner and disposed such that the wafer W is horizontally placed and each shelf plate is in the identical position as seen from above.

Moreover, the shelf plate 3 has a substantially U-shape as seen from above, and the central part thereof is cut out except for a wafer support portion 5 formed in part of the inner circumference such that a robot finger (conveying means) can move up and down while holding an object to be stored. The wafer support portion 5 of the shelf plate 3 that contacts the wafer W is subjected to coating processing by resin and natural rubber so as not to damage the wafer W. Note that the shelf plate 3 that forms the tray is a tabular member in the present embodiment, but the present invention is not limited to this. For example, grooves may be formed at regular intervals in multiple tubular members that are vertically disposed, and edges of the objects to be stored may be placed in the grooves. In addition, it is also possible to reduce the number of parts by integrally molding the multiple spacers 4 and multiple shelf plates 3 that are accumulated in the vertical direction.

An upper plate 6 and a lower plate 7 are fixed above and below the shelf plates 3 forming the tray on which an object to be stored is placed, at respective predetermined intervals. On the outer periphery of the assembly formed of the shelf plates 3 and the upper and lower plates 6 and 7, surfaces other than a body opening portion 10 through which the wafer W passes are covered with a cover 9. This cover 9 is fixed by a screw or bonded to the upper and lower plates 6 and 7 that cover all surfaces except one surface through which the wafer W is conveyed, so as to maintain an airtight state or maintain an internal atmosphere.

Moreover, when a pattern formed on a surface of a semiconductor wafer under processing reacts with oxygen and vapor included in the air and a natural oxide film is formed, the next processing may become incomplete. To eliminate such a trouble, so-called atmosphere replacement processing is required. Examples of the atmosphere replacement processing include "supplying an inert gas such as nitrogen and argon into the substrate storage container 1 and decreasing the oxygen concentration in the substrate storage container 1 to the ppm order" and "setting the inside of the substrate storage container 1 to a low-oxygen or dry state by supplying clean dry air to remove vapor in the air".

Therefore, a nozzle 11 is provided on a surface opposite to the body opening portion 10, through which the wafer W is conveyed, of the substrate storage container 1 of the present invention. The nozzle 11 is used to emit an inert gas such as nitrogen and argon and a clean gas such as clean dry air into the substrate storage container 1. This nozzle 11 is fixed to the lower plate 7, and emits gas, which is supplied from gas supplying means through a tube, from a through hole 12 formed in the lower plate 7 into the substrate storage container 1. Details thereof will be described later.

The opening portion (body opening portion 10) is formed in the cover 9 that covers the body portion formed of an assembly 8, in which the multiple shelf plates 3 and spacers 4 are layered. Rectangular through holes are formed near both ends of the cover 9 which face each other across the body opening portion 10, and a transparent resin cover 13 is attached so as to cover each through hole. This through hole and the transparent resin cover 13 have a function as a window to detect the presence of the wafer W by transmitting light along a sensor optical axis 14 described later.

Note that a resin, in particular, polycarbonate and acrylic are suitable as a material of the transparent resin cover 13. Instead of these resins, however, glass or other materials that are transparent enough to transmit light along the sensor optical axis 14, may be used. Alternatively, by making the internal pressure higher than the external pressure, a slit with a width small enough not to prevent the inside from being maintained at a predetermined atmosphere may be formed in the cover 9 formed of an opaque material that does not transmit light such as stainless steel and aluminum, and the sensor light along the optical axis 14 may be passed through this slit.

This configuration is possible because, by making the external pressure higher than the internal pressure and maintaining an internal atmosphere, it is possible to perform control such that the amount of air or other gases emitted to the outside through the slit is equal to the amount of supplied gas or the supplied amount is larger. In addition, it is also possible to install only one window to detect the wafer in any one surface, and detect the presence of the wafer W by an image recognition system using a reflected-light-type sensor or a camera.

Figure 3A:
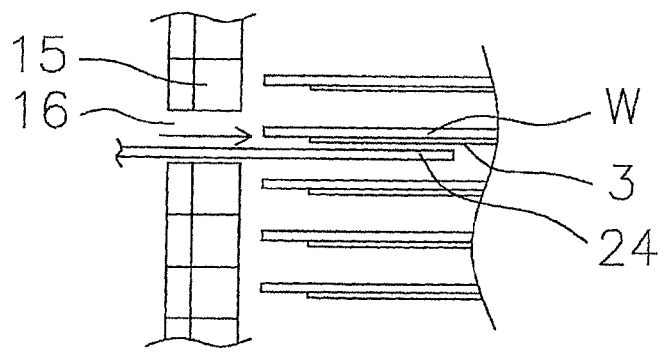
FIG. 3A is a schematic view illustrating wafer transfer operation showing that a robot finger horizontally moves into the substrate storage container.
Figure 3B:
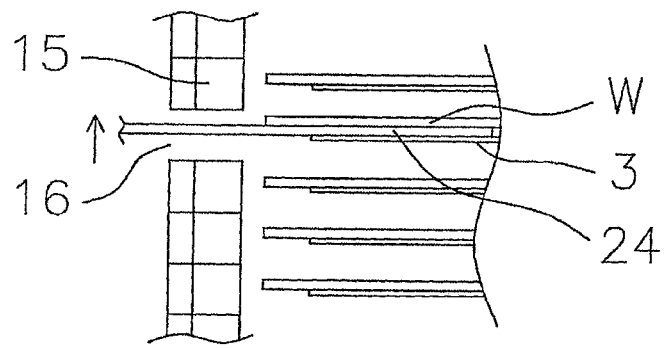
FIG. 3B is a schematic view illustrating wafer transfer operation showing that the robot finger lifts a wafer.
Figure 3C:
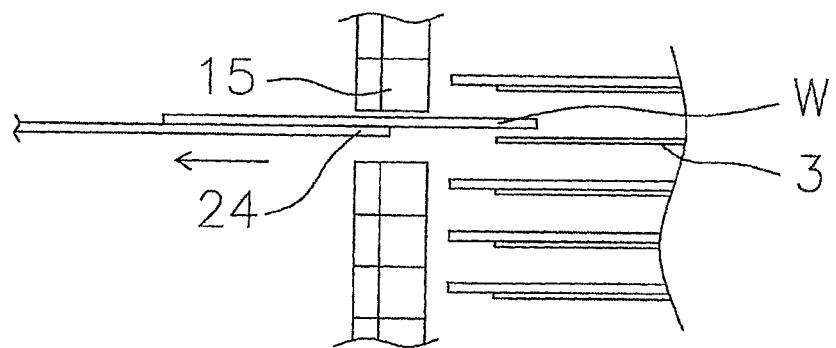
FIG. 3C is a schematic view illustrating wafer transfer operation showing that the robot finger horizontally moves backward with the wafer.

Next, multiple shield plates 15 that close the body opening portion 10 of the substrate storage container 1 and shutter portion S formed by these multiple shield plates 15 will be described with reference to FIGS. 1 to 3. Here, FIG. 3A, FIG. 3B, and FIG. 3C are views illustrating wafer transfer operation in the substrate storage container 1 of the present invention. Each shield plate 15 has a height equal to the vertical interval between the shelf plates 3 accumulated and installed (the height of the shelf plate+the height of the spacer). The shield plates 15 are disposed so as to be supported by the lower plate 7 while being accumulated in the direction vertical to the placement surface of the wafer W. The shield plate 15 has a substantially U-shape as seen from above and is formed so as to cover the body opening portion 10 of the substrate storage container 1 while extending to both outer surfaces thereof (see FIG. 2).

Each shield plate 15 is, in a closed state, disposed so as to be located at almost the center or slightly downward of the vertical interval between two vertically adjacent shelf plates 3. Moreover, the interval between the lower surface of each wafer W and the lower surface of a corresponding shield plate 15 has a height allowing a robot finger 24 to pass through. Therefore, by lifting the corresponding shield plate 15 by the same amount as the height of the shield plate, the shield plate 15 is opened, whereby the robot finger 24 can lift the wafer W stored inside.

When the shield plate 15 is opened, the robot finger 24 horizontally moves straight through the space between the upper surface of the shield plate 15 located below an opening 16 and the lower surface of the wafer W (see FIG. 3A). The opening of the shield plate 15 will be described later using FIG. 6. The inserted robot finger 24 lifts the wafer W by slightly rising, and separates the wafer W from the shelf plate 3 (see FIG. 3B). Next, the robot finger 24 horizontally moves backward and conveys the wafer W to the outside of the substrate storage container 1. At this time, the wafer W is conveyed outside through the space between the upper surface of the shelf plate 3 and the lower surface of the lifted shield plate 15 (see FIG. 3C). Note that the height of the opening 16 is defined by the thicknesses of the wafer W and the finger 24 that holds the wafer W and the rising distance when the finger 24 is lifted. From the viewpoint of maintaining an environment inside the substrate storage container 1, the height of the opening 16 is preferably as small as possible.

Moreover, in order to prevent a horizontal positional shift due to the vertical movement of each shield plate 15, the substrate storage container 1 of the present invention has a structure in which through holes 17 are formed in both right and left sides of each shield plate 15 and a positioning shaft 18 that is a member (position restriction member) to restrict the horizontal position is inserted into each through hole 17. The positioning shaft 18 is disposed so as to be vertical to the surface of the wafer W stored in the storage container like the accumulation direction of the shield plate 15.

Here, the shield plate 15 is opened or closed by vertically sliding the target shield plate 15 and all the shield plates 15 above the target shield plate 15 in a surface vertical to the surface of the wafer W along this positioning shaft 18. Both ends of the positioning shafts 18 are fixed to projection portions formed on both of the right and left sides of the upper and lower plates 6 and 7.

Note that the substrate storage container 1 of the present embodiment includes the columnar positioning shaft 18 as a position restriction member of the shield plate 15, but the present invention is not limited thereto. Instead of a columnar positioning member, for example, a conical projection may be installed on the upper surface of the shield plate 15 and a recess having a shape corresponding to this conical projection may be installed on the lower surface such that it is possible to automatically perform positioning and slide operation of upper and lower shield plates by lamination. Alternatively, a vertically slidable structure may be formed by forming vertical grooves on both of the right and left ends of the shield plate 15 and disposing positioning rails that fit the grooves.

Meanwhile, there may occur a trouble in which, when the shield plate 15 is slid in the vicinity of the body opening portion 10 of the substrate storage container 1, dust is generated due to friction with peripheral members, enters the substrate storage container 1 and is attached to the stored wafer W. Therefore, in the substrate storage container 1 of the present invention, the shutter portion S including the multiple shield plates 15 is disposed at a slight space 19 from each of the cover 9 and the upper and lower plates 6 and 7 on the whole circumference of the body opening portion 10.

Figure 4A:
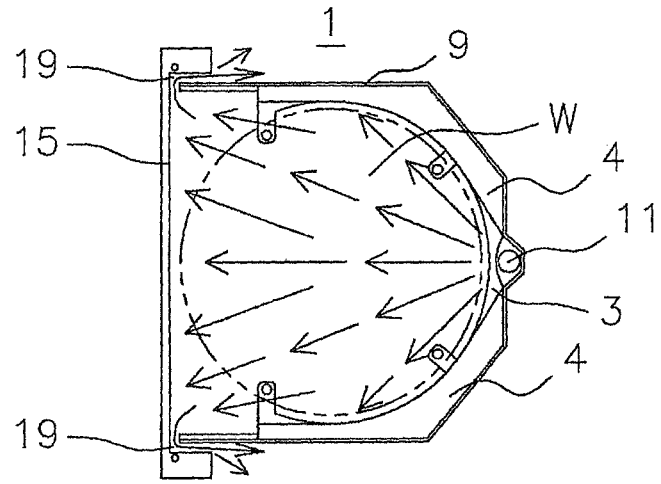
FIG. 4A is a view illustrating the flow of clean gas supplied into the substrate storage container of the present invention as seen from above.
Figure 4B:
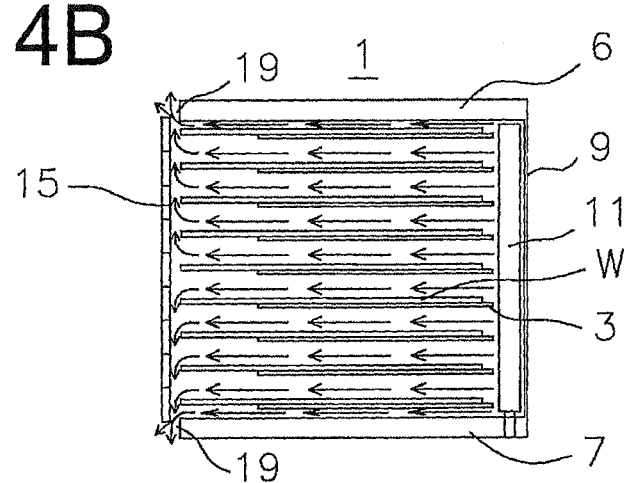
FIG. 4B is a view illustrating the flow of clean gas supplied into the substrate storage container of the present invention as seen from side.

FIG. 4A is a cross-sectional view of the substrate storage container 1 as seen from above, and FIG. 4B is a cross-sectional view thereof as seen from side. In the substrate storage container 1 of the present embodiment, the width of the space 19 between the shield plate 15 and each member such as the cover 9 and the upper and lower plates 6 and 7 around the body opening portion 10 of the substrate storage container 1 is set to 0.5 mm. In addition, if the diameter of the through hole 17 formed in the shield plate 15 is made substantially the same as the diameter of the positioning shaft 18 or made the size up to +0.5 mm from the diameter of the positioning shaft 18, the shield plate 15 can move vertically without contacting the surrounding members.

In a case where clean gas such as inert gas and clean dry air is supplied through the nozzle 11 into the substrate storage container 1 with the shield plate 15 closed, the air retained inside the substrate storage container 1 is pushed out, through the space 19 formed around the above-mentioned body opening portion 10, to the outside of the storage container by the gas emitted from the nozzle 11, and it is possible to shorten time required for atmosphere replacement by the supplied gas. Moreover, by keeping supplying a small amount of gas even after the end of replacement of a predetermined atmosphere, the inside of the substrate storage container 1 has positive pressure as compared with an external environment. When the atmosphere of this positive pressure plays a role of an air seal flowing from the space 19 around the body opening portion 10 to the outside, dust from the outside and the air including vapor can be prevented from entering.

In addition, by such positive pressure, dust generated by friction between the shield plate 15 and the positioning shaft 18 in a case where the shield plate 15 moves up and down, can be prevented from entering the storage container. The space 19 can adopt a shape in which the air can linearly flow out from the inside of the substrate storage container 1. However, by adopting a labyrinthine structure in which the gas flow direction is changed and the flow-out rate is decreased, it is possible to maintain the positive pressure in the substrate storage container 1 while preventing the contact between the shield plate 15 and the peripheral members.

Note that when clean gas is merely supplied from a supply source into the substrate storage container 1, there may occur a problem that the turbulent flow generated by the ejection of gas blows up dust staying still in the substrate storage container 1 and the blown dust is attached to the surface of the wafer W. Therefore, the nozzle 11 included in the substrate storage container 1 of the present invention and serving as a supply nozzle to supply gas introduced from a gas supply source (not illustrated) through a tube into the substrate storage container 1, desirably includes a diffusion suppression member to prevent rapid diffusion.

Figure 4C:
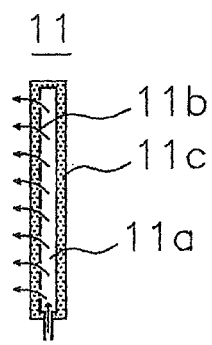
FIG. 4C is a cross-sectional view of the nozzle including a diffusion suppression member illustrating the flow of clean gas supplied into the substrate storage container of the present invention.

FIG. 4C schematically illustrates the cross-sectional shape of the nozzle 11 including a diffusion suppression member 11c. Multiple ejection ports 11b, through which gas is ejected, are formed in an introduction tube 11a through which gas is introduced into the substrate storage container 1. The diffusion suppression member 11c covers the introduction tube 11a in order to prevent gas from rapidly diffusing into the storage container. It is preferable that the diffusion suppression member 11c be formed of a material that can allow the gas ejected from the introduction tube 11a to pass through and can prevent the gas from rapidly diffusing from the introduction tube 11a into the storage container directly, like a porous material for example. Many ejection ports 11b are formed in the introduction tube 11a. It is preferable to form the ejection ports 11b so as to emit gas toward each space in the height direction of the wafer W placed on each shelf plate 3.

It is preferable that the cylindrical diffusion suppression member 11c be a member to suppress the gas ejection power without reducing the outflow of supplied gas as much as possible. Preferable examples of the material include a metal sintered body obtained by sintering porous ceramic, stainless steel or nickel. By supplying inert gas and clean dry air through this ejection power suppression member, it is possible to prevent the occurrence of a turbulent flow and supply gas into the substrate storage container 1 in a laminar flow state. Moreover, it is possible to form a gas flow parallel to the wafer W in a space between the wafers W stored inside while maintaining a positive pressure with respect to the outside, and flow the gas to the outside through the space 19.

In addition, it is also possible to install adjusting means for adjusting the flow rate of gas supplied between a supply source and the nozzle 11, and thereby change the flow rate of the gas in synchronization with the opening/closing operation of the shield plate 15. By this means, it becomes possible to efficiently maintain the low oxygen concentration atmosphere in the substrate storage container 1. For example, when the means for opening and closing the shield plate 15 opens the shield plate 15, a large amount of gas is emitted into the substrate storage container 1 as compared with a state where the shield plate 15 is closed. By this means, even if gas flows out from the opening 16, it is possible to maintain the gas in the substrate storage container 1 at high density. Moreover, by supplying a relatively large amount of gas at the time of opening, it is possible to prevent dust from entering the substrate storage container 1 through the opening 16.

On the other hand, when the shield plate 15 is in a closed state, it is possible to suppress the consumption amount of gas by reducing the supply amount of gas when the gas reaches a given concentration. Regarding the timing to switch the gas supply amount, for example, an oxygen concentration meter is installed in the substrate storage container 1, and the gas supply amount is adjusted when the concentration falls below or exceeds a predetermined oxygen concentration. Alternatively, the supply amount may be adjusted by the timing of each operation or the passage of time like several seconds before and after the opening operation or closing operation of the shield plate 15. Especially, it becomes easy to efficiently adjust the gas supply amount by controlling, by a common control unit, driving means for opening and closing the shield plate 15 and adjusting means for adjusting the gas supply amount.

FIG. 2 illustrates the substrate storage container 11 of the present embodiment including ten shelf plates 3, but the present invention is not limited to this. Normally, a semiconductor wafer W in a semiconductor manufacturing factory moves between steps while being stored in a FOUP 38. Since a general FOUP 38 can internally store 25 semiconductor wafers W, it is preferable in the management of the wafers W to enable the substrate storage container 1 of the present invention to store 25 wafers or multiples thereof.

Moreover, it is possible to vertically accumulate multiple substrate storage containers 1 of the present embodiment.

The upper and lower plates 6 and 7 of the substrate storage box 1 include a positioning member 20 to accurately position upper and lower substrate storage containers 1 when the multiple substrate storage containers 1 are vertically accumulated. The positioning member 20 includes a positioning pin installed on the upper surface of an upper plate and a positioning block installed on the bottom surface of a lower plate.

Figure 5A:
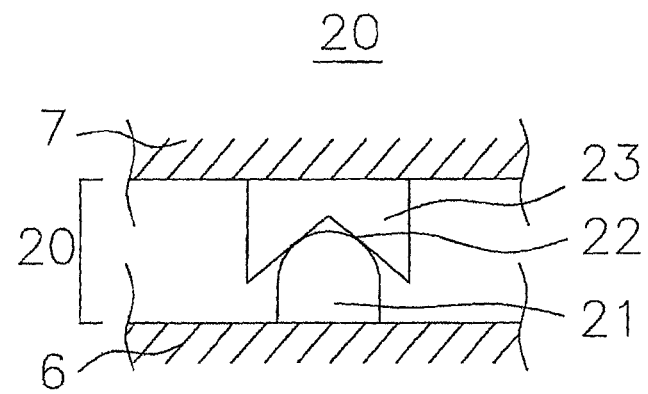
FIG. 5A is a sectional view illustrating positioning members included in the substrate storage container of the present invention.
Figure 5B:
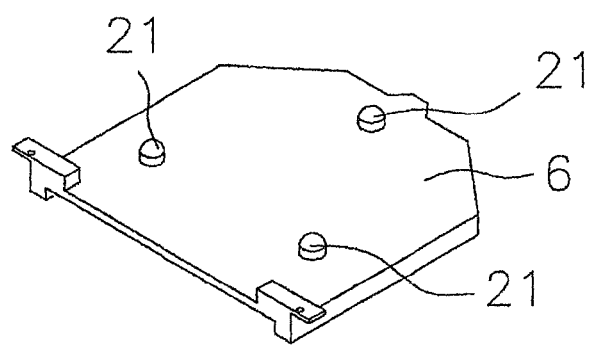
FIG. 5B is a perspective view of an upper plate.
Figure 5C:
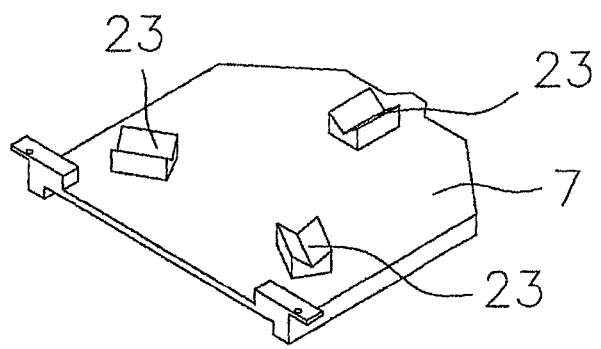
FIG. 5C is a perspective view of a lower plate.

FIG. 5A is a view that exemplifies a state where two substrate storage containers 1 are vertically accumulated, with the positioning member 20 of the upper-side plate 6 of the lower storage container 1 engaged with the positioning member 20 of the lower-side plate 7 of the storage container 1 accumulated on the upper side. FIG. 5B is a perspective view that exemplifies a positioning pin 21 installed on the upper surface of the upper plate 6, and FIG. 5C is a perspective view that exemplifies a positioning block 23 installed on the bottom surface of the lower plate 7. In the example illustrated in FIG. 5A to FIG. 5C, on the upper surface of the upper plate 6, the columnar positioning pins 21 whose upper surfaces have a hemispherical shape protrude from three positions on a predetermined circle. On the bottom surface of the lower plate 7, the positioning blocks 23 each having a groove 22 with a V-shaped cross-section are provided at positions facing the positions from which the positioning pins 21 protrude.

The positioning block 23 illustrated in FIG. 5A to FIG. 5C is provided at a position corresponding to the positioning pin 21 such that the center of the V-shaped groove 22 coincides with a straight line that extends from each central axis of the positioning pin 21. By installing the positioning member 20 of such a shape, the accumulated substrate storage containers 1 are disposed in the vertically identical position accurately. In order to accumulate them more stably, it is desirable to mutually fix each substrate storage container 1 by a member for fixation. Moreover, from the viewpoint of suppressing the accumulation height, it is preferable to make the positioning pin 21 and the positioning block 23 as low as possible. In the present embodiment, the overall height of the positioning member 20 when the positioning pin 21 and the positioning block 23 contact each other is set to about 12 mm.

Figure 6:
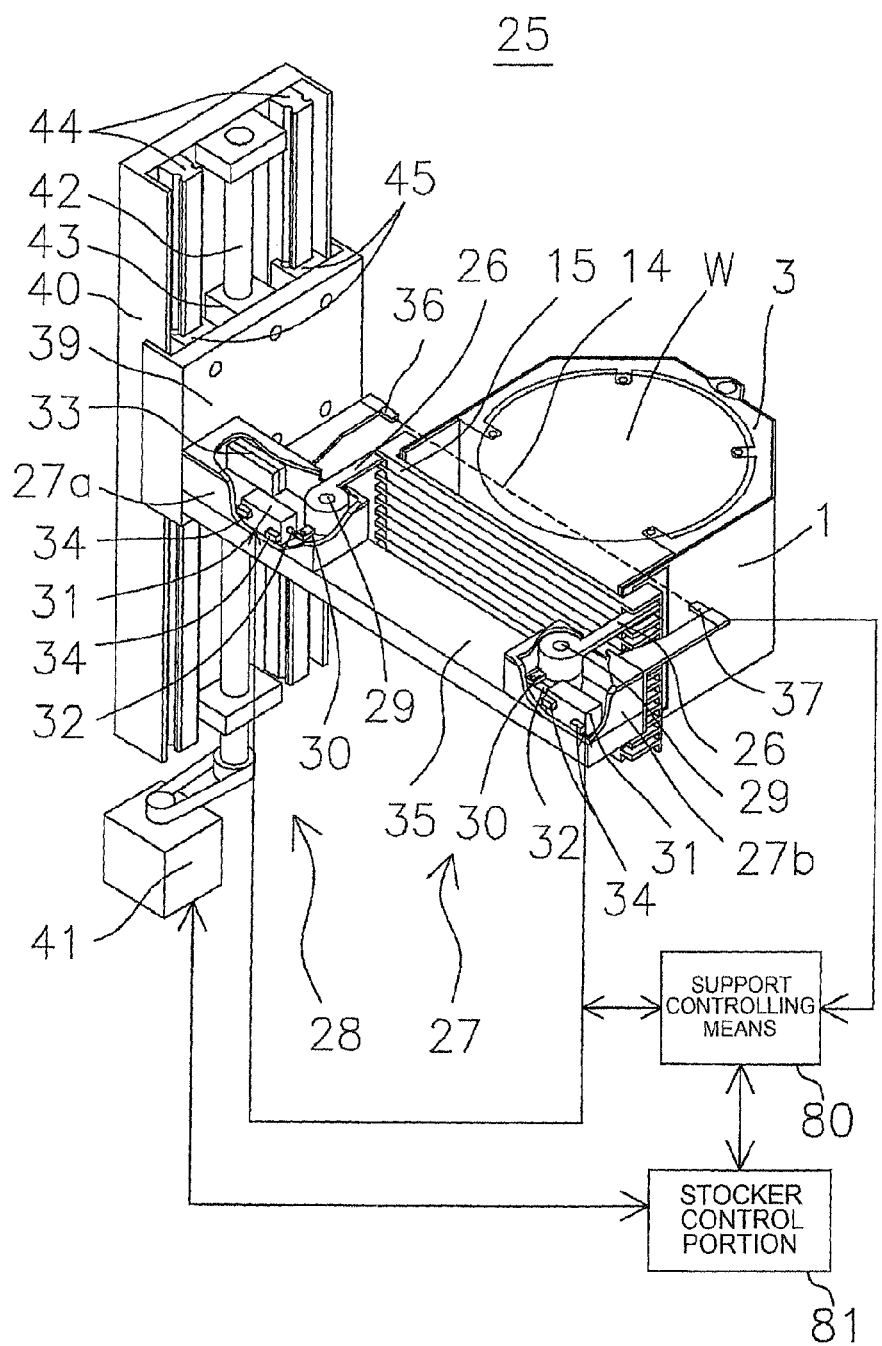
FIG. 6 is a view illustrating an embodiment of a shutter opening/closing unit of the present invention.

Next, a shutter opening/closing unit 25 that opens and closes the shield plate 15 will be described with reference to FIG. 6. FIG. 6 is a partially cutout view that exemplifies the whole of the shutter opening/closing unit 25. The shutter opening/closing unit 25 includes a shutter support mechanism 27 and a lift drive portion 28. The shutter support mechanism 27 inserts a hook 26 for opening and closing into a notch portion formed on each of the right and left ends of the shield plate 15. The lift drive portion 28 moves the shield plate 15 and the shutter support mechanism 27 in the vertical direction.

The leading end of the hook 26 has a shape that can fit the notch portion of the shield plate 15. The hook 26 is rotatably attached to a columnar support shaft 29, which protrudes from the shutter support mechanism 27, through a bearing. A projection portion 30 is formed at the other end of the hook 26, and coupled to a piston rod 32 of an air cylinder 31. Therefore, the projection portion 30 synchronizes with the forward/backward movement of the piston rod 32 by the supply of compressed air to the air cylinder 31, and the hook 26 rotates around the support shaft 29.

Note that since each member of the shutter support mechanism 27 is stored in covers 27a and 27b, the shutter support mechanism 27 has a structure in which dust, even if generated by the rotation operation, does not scatter to the outside. In the example of FIG. 6, the hook 26 is disposed about 30 mm above the upper surface of a support beam 35. In addition, the covers 27a and 27b that cover the support mechanism 27 are disposed so as to be separated by a longer distance than the diameter of the wafer W. Therefore, when the wafer W is carried in and out by the robot finger 24, the finger 24 can pass through a space, which is above the support beam 35 and between the covers 27a and 27b, to access the inside of the substrate storage container 1 and carry in or out the wafer W.

Here, the shutter opening/closing unit 25 of the present embodiment includes the air cylinder 31 as means for rotating the hook 26, but the present invention is not limited to this. For example, a motor or an electromagnet may be used instead of the air cylinder 31, or the hook 26 may be rotated by directly fixing the hook 26 to the rotation shaft of the motor or the rotary actuator. Alternatively, it is possible to adopt a structure in which the hook 26 is linearly reciprocated between a support position and a support release position and engaged with the shield plate 15.

The shutter opening/closing unit 25 of the present embodiment is configured such that the leading end of the hook 26 fits the notch portion of the shield plate 15 and is set at a support position for supporting the shield plate 15 by causing the piston rod 32 to contract and move backward, and is set at a support release position by causing the piston rod 32 to extend and move forward. Here, the supply and shutoff of compressed air to the air cylinder 31 are switched by opening and closing a solenoid valve 33. The opening and closing of this solenoid valve 33 are controlled by support controlling means 80.

Moreover, the air cylinder 31 includes a detection sensor 34 that detects the movement position of the piston rod 32. By detecting the movement position of the piston rod 32, it is possible to detect whether the hook 26 is in the support position or in the support release position. The ON/OFF signal of this detection sensor 34 is transmitted to the support controlling means 80. A pair of movement mechanisms, including the hook 26, the support shaft 29, and the air cylinder 31, is attached to the support beam 35 at laterally symmetric positions with respect to the notch portions formed in both of the right and left ends of the shield plate 15.

In addition, a light projecting portion 36 and a light receiving portion 37 of a light-transmission-type optical sensor, which detects the presence of the wafer W in the substrate storage container 1, are attached to the support beam 35 through brackets so as to face each other. The position and inclination of a light transmission portion 36 and the light receiving portion 37 are adjusted such that the light emitted along the optical axis 14 from the light projecting portion 36 is detected by the light receiving portion 37. Moreover, the light projecting portion 36 is set to a position in which the optical axis 14 of the emitted light penetrates a window portion of the cover 9 and is shielded by the wafer W, while projecting from the support beam 35. The light receiving portion 37 is set while projecting from the support beam 35 so as to be positioned on the optical axis 14 of the light emitted from the light projecting portion 36.

In the above-mentioned structure, when the light projecting portion 36 and the light receiving portion 37 are simultaneously moved in a direction vertical to the surface of the wafer W placed in the substrate storage container 1, the light from the light projecting portion 36 is blocked by the wafer W and does not reach the light receiving portion 37 if the wafer W exists on the shelf plate 3 in the substrate storage container 1. If the wafer W does not exist on the shelf plate 3, the light from the light projecting portion 36 reaches the light receiving portion 37 without being blocked by the wafer W. Based on this information, it is possible to determine the presence of the wafer W in the substrate storage container 1.

If driving means for moving the light projecting portion 36 and the light receiving portion 37 includes means for detecting position information such as an encoder and a sensor, it is possible to detect (mapping) on which shelf plate 3 the wafer W exists and on which shelf plate 3 the wafer W does not exist, by causing a memory device to memorize the timing of light projection and light blocking during movement in the vertical direction. The ON/OFF signal of this light transmission type sensor is transmitted to the support controlling means 80.

Here, the optical axis 14 of the light emitted from the light projecting portion 36 to the light receiving portion 37 may be disposed so as to be parallel to the wafer W on the shelf plate 3. Alternatively, the optical axis 14 from the light projecting portion 36 to the light receiving portion 37 can be disposed while being inclined so as to have a predetermined angle with respect to the wafer W. Especially, since the wafer W cannot block the light sufficiently in a case where the width of the optical axis 14 is larger than the thickness of the wafer W, the optical axis 14 is preferably inclined and disposed.

Next, a detailed description will be given about the support beam 35 as a base member of the shutter support mechanism 27 and the lift drive portion 28 that moves up and down the shutter support mechanism 27 in a direction vertical to the surface of the wafer W. The support beam 35 supports thereon the shutter support mechanism 27 that rotates the hook 26. Moreover, the support beam 35 stores a sensor amplifier that emits light to the above-mentioned light projecting portion 36, detects light received in the light receiving portion 37 and outputs the light to the support controlling means 80 as an ON/OFF signal.

The support beam 35 has a rectangular parallelepiped shape that extends in the horizontal direction, where one side is fixed to a lift base 39 of the lift drive portion 28. The support beam 35 of the present embodiment has a one-side support structure in which one end is fixed to the lift base 39. Therefore, for example, the support beam 35 is preferably formed of a light, highly rigid member such as an aluminum material, stainless steel and carbon fiber in order to suppress flexure caused by the weight of the support beam 35 itself and the weight of the lifted shield plate 15. Here, it is also possible to install the lift mechanism at each of both ends of the support beam and fix both ends of the support beam 35 to the lift base 39.

The lift drive portion 28 includes a box-shaped frame 40, a ball screw shaft 42, and a ball nut 43. The box-shaped frame 40 has a substantially U-shaped cross-section with one side thereof opened, and is vertically elongated. In the box-shaped frame 40, the ball screw shaft 42 is coupled to a motor 41 that is a drive source through a pulley and a belt. The ball nut 43 fits the ball screw shaft 42 and moves up and down by rotational motion of the screw shaft 42. The box-shaped frame 40 is set so as to be vertical to the surface of the wafer W stored in the substrate storage container 1, where the open surface faces a direction in which the support beam 35 is disposed. The ball screw shaft 42 is disposed in the box-shaped frame 40 in parallel to the setting direction of the box-shaped frame 40.

The lift drive portion 28 further includes two slide guides 44 constructed on both sides of the ball screw shaft 42 in parallel to the ball screw shaft 42 in the box-shaped frame 40. Moving elements 45 of these two slide guides 44 and the ball nut 43 are mutually fixed by the lift base 39. With this configuration, the lift drive portion 28 can smoothly move up and down the lift base 39 and the shutter support mechanism 27 fixed to the lift base 39 by the rotational driving force of the motor 41.

Here, dust is highly likely to be generated due to friction from the ball screw shaft 42 and the slide guide 44 by lift operation. Therefore, it is desirable that the lift base 39 have a shape to prevent dust from scattering from the box-shaped frame 40 to the outside. For example, the lift base 39 of the present embodiment has a substantially U-shape as seen from above so as to cover the open part of the box-shaped frame 40, and prevents dust from scattering.

As the motor 41 that is a drive source, an AC/DC servomotor and a stepping motor are suitable because they have a high responsiveness and a positioning function. In addition, it is desirable to provide brake means for preventing the rotation shaft of the motor 41 from rotating at power-off time such that the shutter support mechanism 27 and the lift base 39 do not fall by their own weights when the power supply to the motor 41 is turned off.

In the lift drive portion 28 of the present embodiment, the lift base 39 is moved up and down by transmitting the rotational driving force of the motor 41 to the ball screw shaft 42. However, the present invention is not limited to this. Instead of the ball screw type, for example, a pinion gear meshing with a rack constructed in the box-shaped frame 40 may be rotationally driven by a motor to perform lift movement. Alternatively, the lift movement may be performed by rotating a vertically bridged belt by a motor. In addition, it is also possible to adopt a lift drive mechanism using a linear motor. However, in the present embodiment as well, when the lift drive is performed by the above-mentioned driving means, it is desirable to provide measures to avoid troubles such as a fall of a member due to its own weight at power-off time and a drop by belt cutting.

Next, the operations of the shutter support mechanism 27 and the lift drive portion 27 will be described. The operation of electrical parts such as the motor 41, the air cylinder 31, and the detection sensor 34, which are included in the shutter support mechanism 27 and the lift drive portion 28, is controlled by a stocker control portion 81. First, mapping operation is performed to detect on which shelf plate 3 in the accumulated substrate storage containers 1 the wafer W exists. The mapping operation is performed by moving up or down the shutter support mechanism 27 from the upmost or lowermost one of the accumulated substrate storage containers 1 to the other, and vertically moving the optical axis 14 connecting the light projecting portion 36 and the light receiving portion 37.

The lift drive portion 28 having received a movement instruction of the motor 41 transmitted from the stocker control portion 81 raises and lowers the shutter support mechanism 27 while controlling the rotation of the motor 41 such that, for example, the optical axis 14 moves from the lowermost to uppermost of the substrate storage container 1. When the optical axis 14 is blocked by the wafer W during the movement, the support controlling means 80 of the shutter support mechanism 27 transmits a sensor light-shielding signal to the stocker control portion 81. The control portion 81 having received the sensor light-shielding signal causes memory means included in the stocker control portion 81 to memorize position data of the shutter support mechanism at the time of the reception of the signal. When the lift drive portion 28 further moves and passes the wafer W that blocks the optical axis 14, the optical axis enters the light receiving portion again. The support controlling means 80 of the shutter support mechanism 27 also transmits this incident signal to the stocker control portion 81.

The stocker control portion 81 having received the incident signal causes the memory means included in the stocker control portion 81 to memorize position data of the shutter support mechanism 27 at the time of the reception of the signal. Here, the thickness of an object that blocks the optical axis 14 can be determined by comparing the position data at the time of blocking the optical axis 14 with the position data at the time of incidence. Thickness data at this time and thickness data of the wafer W taught beforehand are compared to determine whether an object that blocks the optical axis 14 is the wafer W. In a case where the object is recognized as the wafer W, it is compared with position data of the shelf plate 3 taught beforehand, and the memory means is caused to memorize on which shelf plate 3 the wafer W exists. By repeating this processing during the movement of the shutter support mechanism, data as to the presence of the wafer on each shelf plate 3 (mapping data) is created, and memorized in the memory means.

When the accumulated substrate storage containers 1 are scanned by moving the optical axis 14 from the lower end to the upper end, components such as the upper plate 6 and the lower plate 7 other than the wafer W also block the optical axis 14. To distinguish data obtained when these components block the optical axis 14 from data obtained when the wafer W blocks it, the memory means included in the stocker control portion 81 is caused to memorize the thicknesses and vertical positions of the components beforehand by teaching operation. In addition, the position of each shelf plate 3 is taught and memorized. In a case where it is recognized that the object that blocks the optical axis 14 is not the wafer W, the data is discarded. In a case where it is recognized that the object is the wafer W, the position data and data taught beforehand are compared to memorize, as data, on which shelf plate 3 the wafer is placed.

Next, the opening/closing operation of the shield plate 15 will be described. First, the stocker control portion 81 transmits a movement instruction to the lift drive portion 28 so as to move to the opening and closing position of the target shield plate 15. The lift drive portion 28 drives the motor 41 on the basis of position data taught and memorized beforehand in the memory means, and moves the shutter support mechanism 27. After the movement, when the stocker control portion 81 transmits a shutter clamp instruction to the support controlling means 80 of the shutter support mechanism 27, the support controlling means 80 of the shutter support mechanism 27 operates the solenoid valve 33, supplies compressed air to the air cylinder 31 and rotates the hook 26 to a closing position. Since the rotation of the hook 26 is detected by the detection sensor 34, upon reception of the detection signal, the support controlling means 80 of the shutter support mechanism 27 transmits a shutter clamp completion signal to the stocker control portion 81.

The stocker control portion 81 having received the shutter clamp completion signal then transmits a lift-up instruction of the shield plate 15 to the lift drive portion 28. The lift drive portion 28 having received the lift-up instruction drives the motor 41 on the basis of lift movement data taught and memorized beforehand in the memory means, and performs lift-up operation of the shield plate 15. When the lift-up operation of the shield plate 15 ends, the lift drive portion 28 transmits a lift completion signal to the stocker control portion 81 and the lift-up operation of the shield plate 15 is completed. Here, if the relative positions of the hook 26 and the optical axis 14 are defined beforehand such that the light from the light projecting portion 36 is blocked by the target wafer W at a position where the lift drive portion 28 completes this lift-up operation, it becomes possible to reconfirm the stock of the wafer W after operation to open the shield plate 15 is completed. In this manner, it becomes possible to prevent troubles which would otherwise occur at the time of the conveyance of the wafer W.

Here, since the robot finger 24 can access the shelf plate 3 when the shield plate 15 is opened, it is possible to perform predetermined conveyance operation of the wafer W. When the conveyance of the wafer W ends, lift-down operation of the shield plate 15 is performed next. The lift-down operation of the shield plate 15 is performed through the reversed procedure of the above-mentioned lift-up operation.

When a move-down instruction of the shield plate 15 is transmitted from the stocker control portion 81, the lift drive portion 28 having received the instruction drives the motor 41 so as to return to the position before the lift-up operation is performed. Then, the stocker control portion 81 transmits a shutter unclamp instruction to the support controlling means 80 of the shutter support mechanism 27 to perform unclamp operation. When the unclamp operation ends, the stocker control portion 81 transmits a movement instruction to the support controlling means 80 so as to move the shutter support mechanism 27 to the next predetermined position, or transmits an instruction such that the shutter support mechanism 27 waits at that position, and the opening/closing operation of the shield plate 15 ends.

Figure 7:
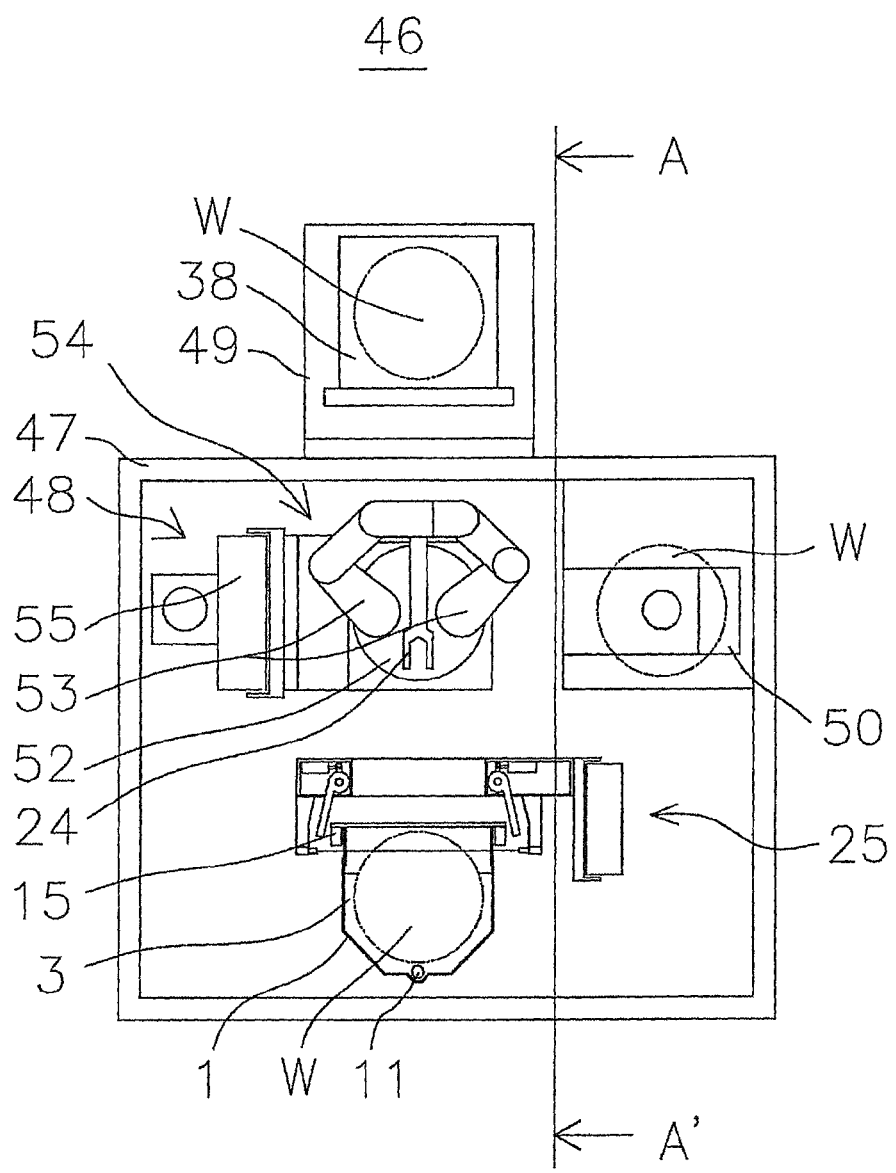
FIG. 7 is a top view illustrating a wafer stocker according to an embodiment of the present invention.
Figure 8:
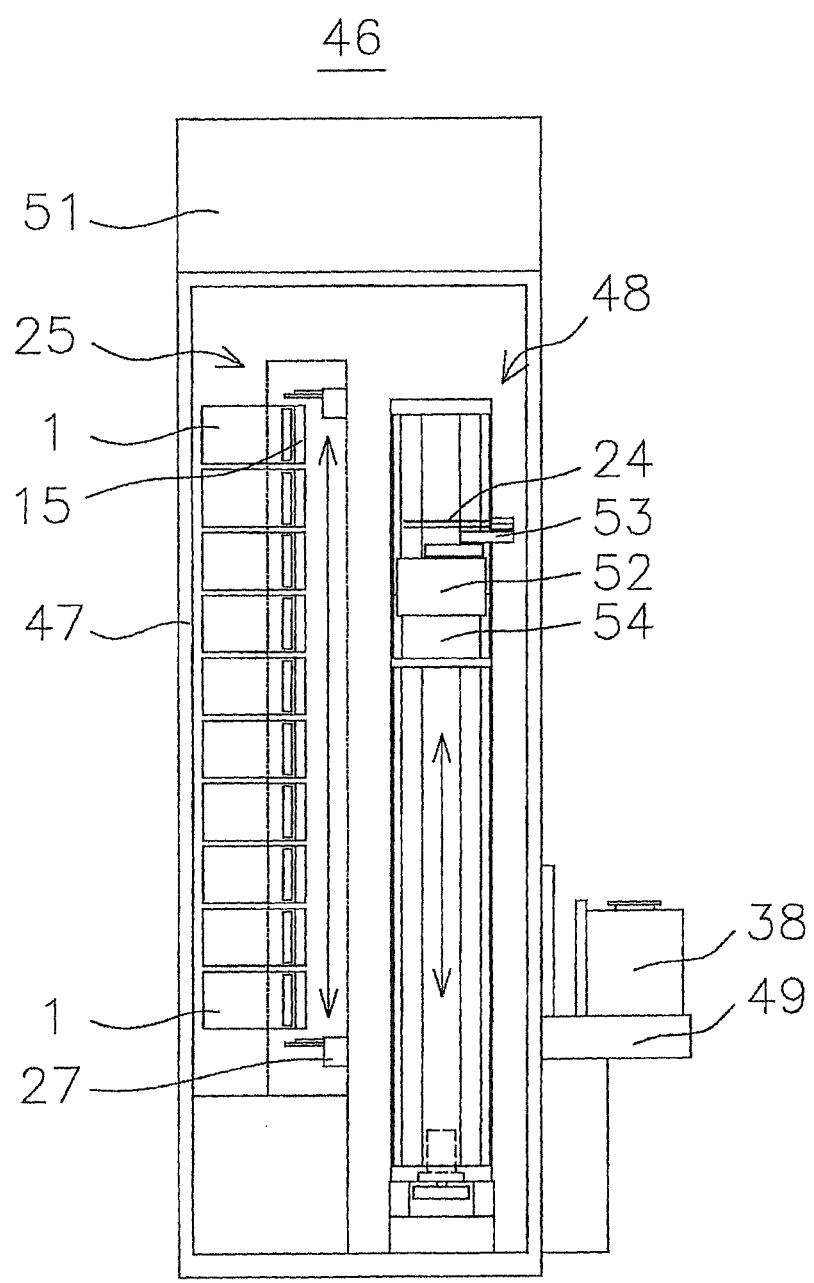
FIG. 8 is a cross-sectional view illustrating the wafer stocker according to the embodiment of the present invention.

Next, a wafer stocker 46 that is an embodiment of the present invention will be described in detail with reference to FIGS. 7 and 8. FIG. 7 is a plan view illustrating the wafer stocker 46 that is a first embodiment of the present invention, and FIG. 8 is a cross-sectional view as seen from line A-A' illustrated in FIG. 7.

The stocker 46 of the present embodiment includes a clean booth, the substrate storage containers 1, the shutter opening/closing unit 25, a wafer conveyance portion 48, an opener 49, and an aligner 50. The clean booth includes a frame 47 that forms a space inside and a cover that shields the inside from the external environment. The substrate storage containers 1 are fixed to the frame 47 in an accumulated manner. The shutter opening/closing unit 25 opens and closes the shield plate 15 of the substrate storage container 1. The wafer conveyance portion 48 conveys the wafer W between the substrate storage container 1 and the FOUP 38. The opener 49 is joined to the frame 47, places thereon the FOUP 38 that is an airtight container and opens the inside. The aligner 50 positions the wafer W in the horizontal direction and the rotation direction.

In addition, an FFU (Fan Filter Unit) 51 to form the flow of air in the wafer stocker 46 from upward to downward is installed on the upper surface of the frame 47. The FFU 51 filters the air sucked from the outside by a filter into a clean state from which dust is removed, and sends the clean air as a laminar flow into the wafer stocker 46. In this manner, the air pressure in the clean booth is maintained slightly higher than the external environment. Moreover, an opening portion is formed in the bottom surface of the clean booth such that the clean air of the laminar flow sent from the FFU 51 flows out to the external environment.

It is preferable that the opening portion be configured to adjust the opening area, and the air including dust from the outside is prevented from entering by the FFU 51 and this opening portion whose opening area is appropriately adjusted. At the same time, by efficiently exhausting dust generated from a drive mechanism or the like disposed in the clean booth to the outside, it is possible to maintain the internal space of the wafer stocker 46 at a clean atmosphere.

The opener 49 has a placement stand on which the FOUP 38 is placed, an opening portion for distribution of the wafer W, and a door to open and close this opening portion. When the FOUP 38 is placed on the placement stand, the door is lowered after the door and the lid of the FOUP 38 are integrated, and communication between the inside of the FOUP 38 and the internal space of the wafer stocker 46 is enabled with the wafer stocker 46 sealed from the outside.

The aligner 50 is a device that performs alignment between the center position of the wafer W and a recess called a notch formed for alignment. The aligner 50 also has a function to read the unique ID number that is given to each wafer W and marked on the surface of the wafer W at the same time as the alignment. This aligner 50 is not an essential component for the wafer stocker but becomes necessary in a case where it is necessary to individually manage the wafers W according to each ID.

The wafer conveyance portion 48 includes a cylindrical coordinate robot 54. The cylindrical coordinate robot 54 includes two arm bodies 53 that are coupled to a base 52 by a predetermined pulley and a timing belt at a reduction ratio. The base 52 performs turn operation in the horizontal surface by motor drive. The leading end of each arm body 53 includes the finger 24 to suck and hold the wafer W (only one finger 24 is illustrated in FIG. 7, since the vertical positions of the fingers 24 overlap). The cylindrical coordinate robot 54 has a structure in which the arm body 53 performs bending and stretching operation when each arm rotates by the driving force of the motor in the horizontal surface, and the finger 24 included in the leading end is linearly moved by this bending and stretching operation.

Moreover, by the turn operation of the base 52 and the bending and stretching operation of the arm body 53, it is possible to convey the wafer W held by the finger 24 to a predetermined position in the horizontal surface. The wafer conveyance portion 48 further includes a Z-axis drive portion 55 that moves up and down this cylindrical coordinate robot 54 along a direction in which the substrate storage containers 1 are accumulated. The wafer conveyance portion 48 can thus access the substrate storage container 1 of a different height.

In the wafer stocker 46 of the present embodiment, the cylindrical coordinate robot 54 is disposed in the central part as seen from above. The substrate storage container 1, the opener 49, the aligner 50 and the like are disposed on a concentric circle centering on the pivot of the turnable base 52 of this robot 54. The substrate storage container 1 and the opener 49 are disposed at positions where their opening portions face each other across the robot 54.

Moreover, the substrate storage container 1 has a structure in which ten disposed shelf plates 3 are assumed to be one set and ten sets are accumulated. In this manner, it is possible to store 100 wafers W, and this corresponds to four FOUPs 38 each of which can internally store 25 wafers W. Here, it is possible to dispose ten sets or more, and the accumulation height is restricted by the ceiling height and the like of a factory where a stocker device is installed.

A pipe to supply gas such as inert gas and clean, dry air to the internal nozzle 11 is connected to each substrate storage container 1. The pipe includes a pipe to supply the gas at a large flow rate until a predetermined low oxygen concentration is reached when the shutter is opened and after the shutter is closed, and a pipe to supply the gas at a small flow rate to maintain the inside of the substrate storage container 1 at a predetermined oxygen concentration after the predetermined low oxygen concentration is reached. That is, two pipes are connected to each substrate storage container 1. The pipe for the large flow rate and the pipe for the small flow rate are switched by individual electromagnetic selector valves. The pipes are switched by the stocker control portion 81 included in the wafer stocker 46.

A supply source of inert gas and clean, dry air may be stored in a tank or they may be supplied from a supply tank installed in a factory. In addition, since the gas supplied from the supply source may contain dust generated from members such as a storage tank, a pipe, and a joint, the gas is supplied while being maintained in a clean state through a clean filter for dust collection on the way. After the supply pressure of the gas supplied from the supply source is adjusted by a regulator, the gas is adjusted to have a large flow rate and a small flow rate by flow regulating valves corresponding to the respective substrate storage containers 1. The edges of the flow regulating valves for the large flow rate and the small flow rate are connected to a selector valve, and gas at a predetermined flow rate is supplied to a desired substrate storage container 1 by an electric signal from the stocker control portion 81.

Next, the operation of the wafer stocker 46 of the present embodiment will be described. The wafer W stored in the FOUP 38 is carried to a FOUP placement stand on the opener 49 by AGV (Automated Guided Vehicle), OHT (Overhead Hoist Transfer) or hand. After that, when the lid is opened by the opener 49, the wafer W stored inside is conveyed to the aligner 50 by the robot 54. When the notch alignment and the reading of the ID number are performed by the aligner 50, the read ID number is memorized in the memory means of the stocker control portion 81 included in the stocker 46.

Here, the stocker control portion 81 having memorized the ID number refers to data as to the presence of the wafer on each shelf plate 3, which has been acquired by the above-mentioned mapping operation of the shutter opening/closing unit 25, and issues an instruction so as to place the wafer W on the shelf plate 3 of a predetermined substrate storage container 1, and the wafer conveyance portion 48 conveys the wafer W to the position of the designated shelf plate 3. Here, the stocker control portion 81 operates a selector valve of a pipe in communication with the storage container 1 and increases the amount of inert gas supplied into a storage container into which the wafer W is scheduled to be carried.

Next, the shutter opening/closing unit 25 performs operation to open the shield plate 15. The inert gas keeps flowing out through the opening 16 of the shield plate 15 when the shield plate 15 is opened. Therefore, dust generated by the opening operation of the shield plate 15 flows to the outside from the lower part of the stocker 46 by a downward clean laminar flow generated by the FFU without entering the substrate storage container 1. When the shield plate 15 is opened, the finger 24 holding the wafer W is inserted into a position taught beforehand in the substrate storage container 1. After that, the finger 24 performs lift-down operation only by a movement amount taught beforehand, and places the wafer W on the shelf plate 3. After the wafer W is placed, the wafer conveyance portion 48 moves the finger 24 back to a standby position, and the placement step of the wafer W ends.

After the placement step of the wafer W ends, the stocker control portion 81 lowers the shutter opening/closing unit 25 to perform closing operation of the shield plate 15. At this time, inert gas at a large flow rate is kept being supplied since the inside of the substrate storage container 1, into which the wafer W has been carried, does not reach a predetermined low oxygen concentration yet. When a defined concentration is reached, the flow rate is switched to a small flow rate. Here, the substrate storage container 1 in which the shield plate 15 is not opened or closed maintains a state where the inert gas at a small flow rate is supplied in order to maintain the inside at a predetermined low oxygen concentration.

Next, the conveyance of the stored wafer W out to the FOUP 38 is possible through the reversed operation sequence. The stocker control portion 81 having received an instruction to carry a predetermined wafer W out from a host program that manages the steps of the entire semiconductor manufacturing factory carries the predetermined wafer W into an empty FOUP 38 on the basis of data memorized in the memory means. Since the ID number of each wafer W is acquired and managed at the time of carrying the wafer in, the wafer does not have to pass the aligner at the time of being carried out and is directly conveyed from the substrate storage container 1 to the FOUP 38.

For example, in a case where an instruction to carry two wafers out is issued, operation of placing two wafers W on the FOUP 38 at the same time becomes possible since the two fingers 24 respectively included in the two arm bodies 53 can extract the wafers W from the substrate storage container 1. Especially, when the interval between the upper and lower fingers 24 is set equal to an interval of the FOUP 38 to place the wafer W, it is possible to carry in two wafers W at the same time by extending and contracting the two arm bodies 53 at the same time, thereby shortening the conveyance time.

Figure 9:
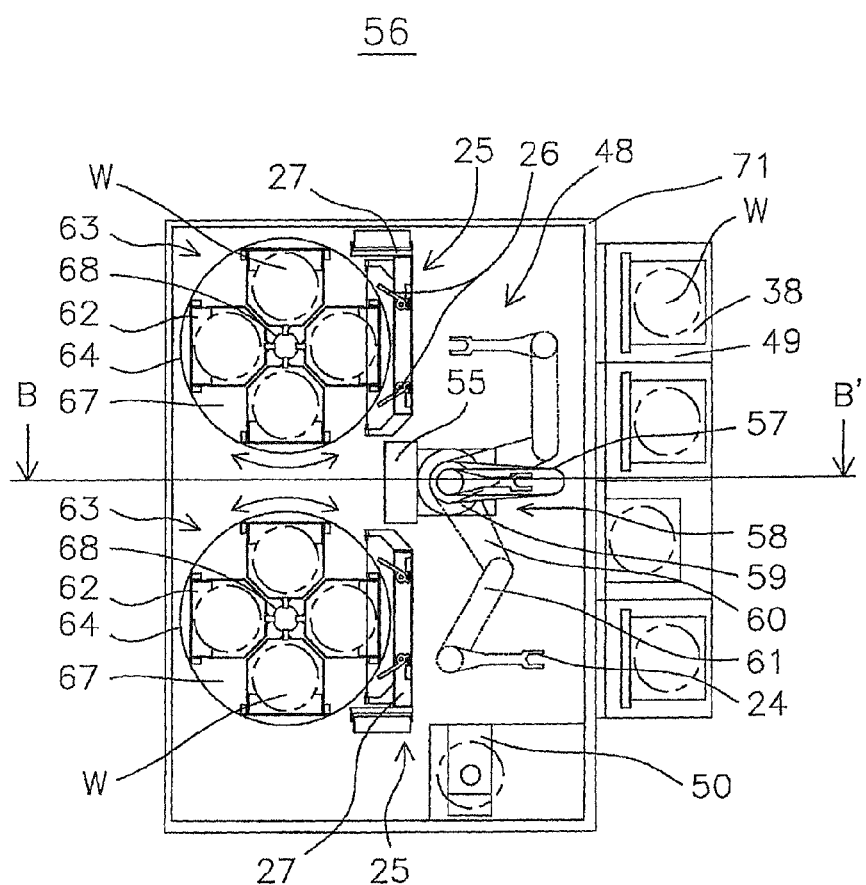
FIG. 9 is a top view illustrating a wafer stocker according to another embodiment of the present invention.
Figure 10:
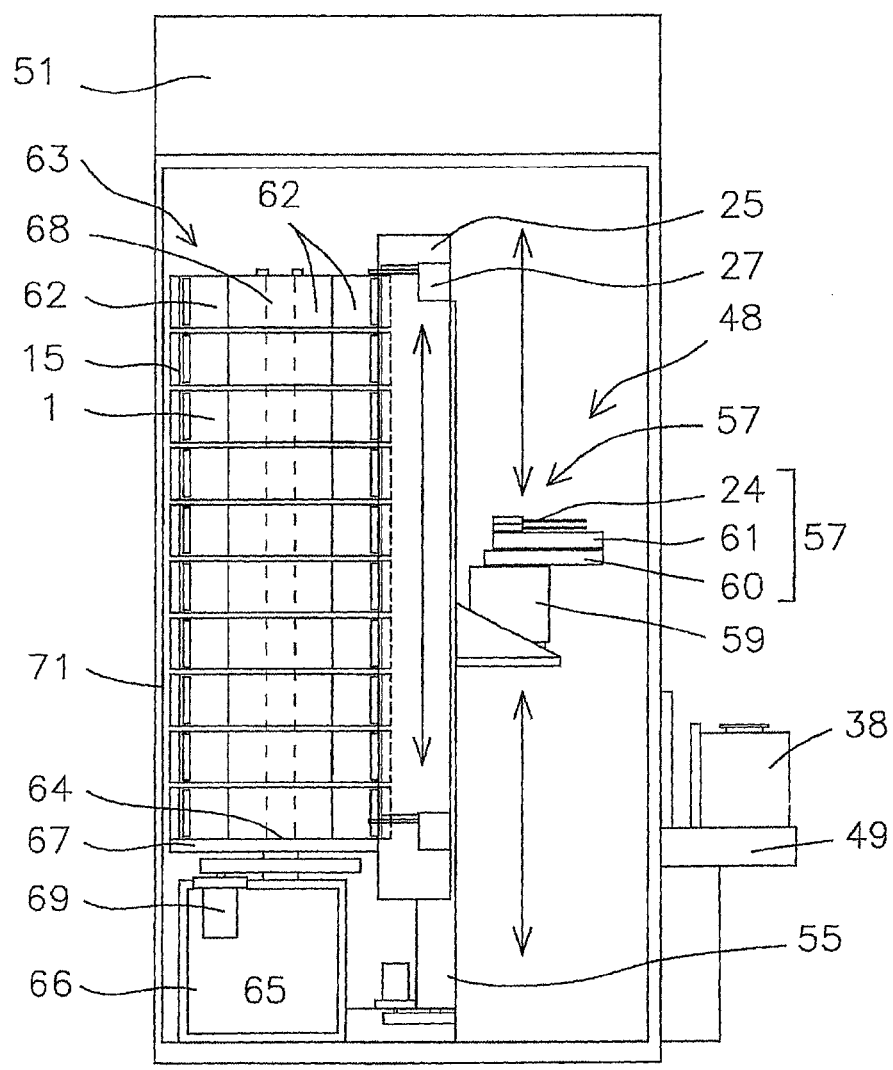
FIG. 10 is a cross-sectional view illustrating the wafer stocker according to the another embodiment of the present invention.

Next, a wafer stocker 56 according to a second embodiment of the present invention will be described with reference to FIGS. 9 and 10. FIG. 9 is a plan view illustrating the wafer stocker 56 of the present embodiment, and FIG. 10 is a cross-sectional view of the wafer stocker 56 of FIG. 9 as seen from line B-B' of FIG. 9. The conveyance robot included in the wafer stocker 56 of the present embodiment includes a horizontal articulated robot 58 instead of the cylindrical coordinate robot 54 according to the first embodiment. In this case, the horizontal articulated robot 58 can independently rotate base ends of the arms of arm bodies 57 by individual motors, whereas the cylindrical coordinate robot 54 has a structure in which the arm bodies and fingers 24 coupled through the pulley and the belt at a predetermined reduction ratio are extended and contracted in the linear direction. Since each arm of this horizontal articulated robot 58 is rotatable, the horizontal articulated robot 58 can access not only the front of the robot 58 but also the diagonal front or diagonal rear of the robot 58 as illustrated in FIG. 9.

The horizontal articulated robot 58 mounted on the wafer stocker 56 of the present embodiment includes a first arm 60, a second arm 61, and two fingers 24. One end of the first arm 60 is rotatably supported to a base 59. One end of the second arm 61 is rotatably supported to the other end of the first arm. One end of each finger 24 is rotatably supported to the other end of the second arm. The first arm 60, the second arm 61, and the two fingers 24 are connected in a rotatable manner by respective motors.

With this structure, as compared with a case where the cylindrical coordinate robot 54 can merely perform linear extension and contraction operation toward a target position, it becomes possible to access in directions such as the diagonal front and the diagonal rear when each arm and finger 24 can perform interpolation operation. Similar to the first embodiment, the present embodiment also includes a Z-axis drive portion 55 that moves up the horizontal articulated robot 58 along the direction in which the storage containers are accumulated, and each finger 24 is configured to access the accumulated substrate storage containers 1.

Moreover, two storage units 63 are included in the wafer stocker 56 of the present embodiment. Each storage unit 63 includes four storage shelves 62 each formed by accumulating the substrate storage containers 1 in the vertical direction. The four storage shelves 62 are installed at equal intervals with an angle of 90 degrees such that each body opening portion 10 faces the outside. It is possible to rotate these four storage shelves 62 in the horizontal surface. The storage unit 63 includes a support member 64 that supports the four storage shelves 62 installed at equal intervals, and a rotation drive portion 65 that rotates this support member 64.

The support member 64 included in the present embodiment has a structure in which the storage shelf 62 is placed on a circular rotary table 67 rotatably fixed to a base 66 through a bearing. A support column 68 including a fixing member that fixes the upper part of each storage shelf 62 is set up in the center of this rotary table 67. The rotary table 67, the support column 68, and each storage shelf 62 are integrally rotated in the horizontal surface by the driving force of the rotation drive portion 65. In addition, if the storage shelves 62 are mutually fixed by a coupling member, each storage shelf 62 does not swing by the inertial force even in the rotation and stop operation of the rotary table 67.

The rotation drive portion 65 that rotates the above-mentioned support member 64 has a structure in which the driving force of a motor 69 that can control a rotation position like a stepping motor and a servo motor is transmitted via a belt bridged between a pulley fixed to the rotation shaft of the motor 69 and a pulley fixed to the bottom surface of the rotary table 67. The motor 69 is controlled by a control unit (not illustrated) included in the storage unit 63, and the control unit can rotate and move the support member 64 at an arbitrary rotation angle.

Moreover, the shutter opening/closing unit 25 is disposed at a position adjacent to the storage unit 63. After the rotary table 67 stops at a predetermined rotation position, therefore, it is possible to open and close the shield plate 15 of the substrate storage container 1. Here, high positioning accuracy is required to stop the storage unit 63 at a position where the hook 26 can be inserted into a notch formed in the shield plate 15. Therefore, it is possible to install a sensor 70 that determines whether the rotary table 67 stops at a predetermined position.

The wafer stocker 56 of the present embodiment includes four openers 49 on which the FOUPs 38 are placed and which open and close the lids of the FOUPs 38. The opener 49 is joined to a frame 71 of the stocker 56.

The wafer conveyance portion 48, on which the horizontal articulated robot 58 is mounted, is disposed at a position facing the opening part of the placed FOUP 38. The shutter opening/closing units 25 are disposed on both of the right and left sides of the wafer conveyance portion 48, and the storage units 63 are disposed at the positions corresponding to these shutter opening/closing units 25.

Moreover, in an arm movement space formed among the opener 49, the wafer conveyance portion 48, and the shutter opening/closing unit 25 in the wafer stocker 56, the aligner 50 that positions the wafer W is disposed at a position that does not interfere with the wafer W conveyance operation of the arm body 57. In addition, the FFU 51 is installed on the upper part of the frame 71 and the cover that form the wafer stocker 56, and a clean booth is formed in the wafer stocker 56 by the frame 71, the unillustrated cover, and the FFU 51.

In the wafer stocker 56 of the present embodiment, similar to the first embodiment, one storage shelf 62 can store 100 wafers W. The number of wafers W to be stored in two storage units 63 becomes 800 in total, which is much larger than the storage number of the first embodiment. In addition, although the number of wafers W to be stored in the storage shelf 62 is restricted by the installation environment of a semiconductor manufacturing factory where the storage shelf 62 is installed, it is possible to greatly increase the storage number in the entire device by increasing the storage number of the storage shelf 62.

Figure 11:
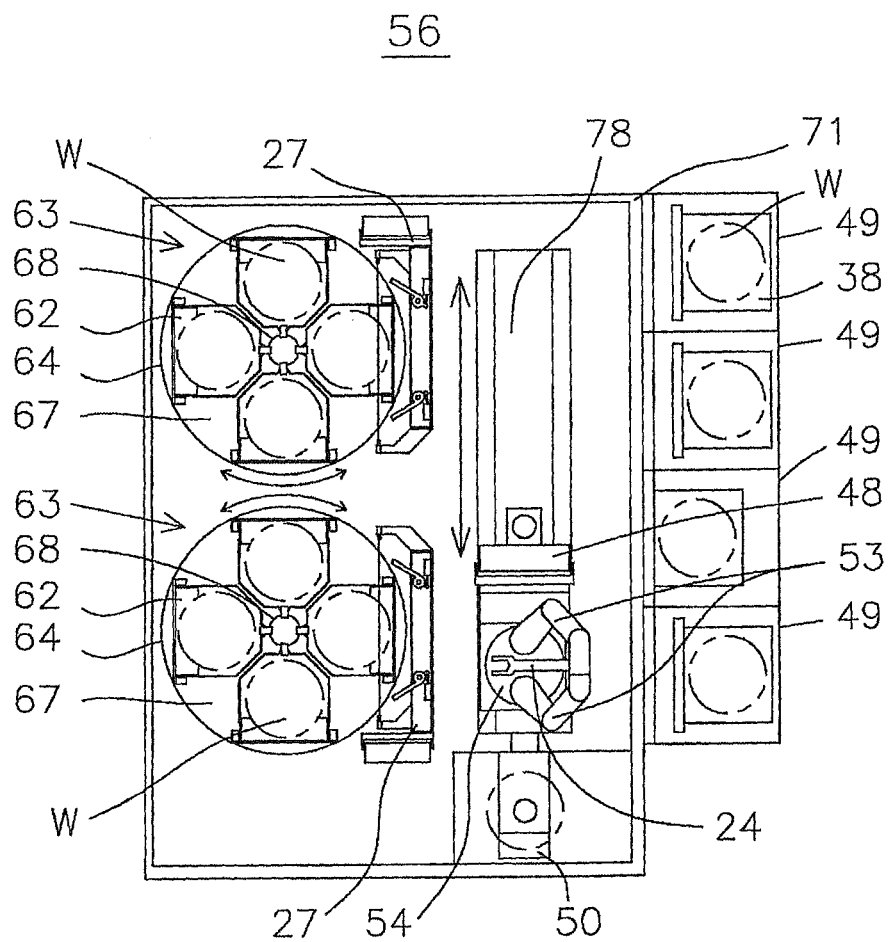
FIG. 11 is a top view illustrating a wafer stocker including a storage unit according to another embodiment of the present invention.

In the present embodiment, it is assumed that the horizontal articulated robot 58 is installed. However, as illustrated in FIG. 11, there may be additionally installed horizontal movement means 78. The horizontal movement means 78 reciprocates the wafer conveyance portion 48 including the cylindrical coordinate robot 54 in parallel in a horizontal surface with respect to a row in which the openers 49 are disposed. In this case, the cylindrical coordinate robot 54 may be moved to a position facing the FOUP 38 or the storage shelf 62, and the conveyance of the wafer W may be performed by the forward/backward movement of the arm body 53 in the linear direction.

Figure 12:
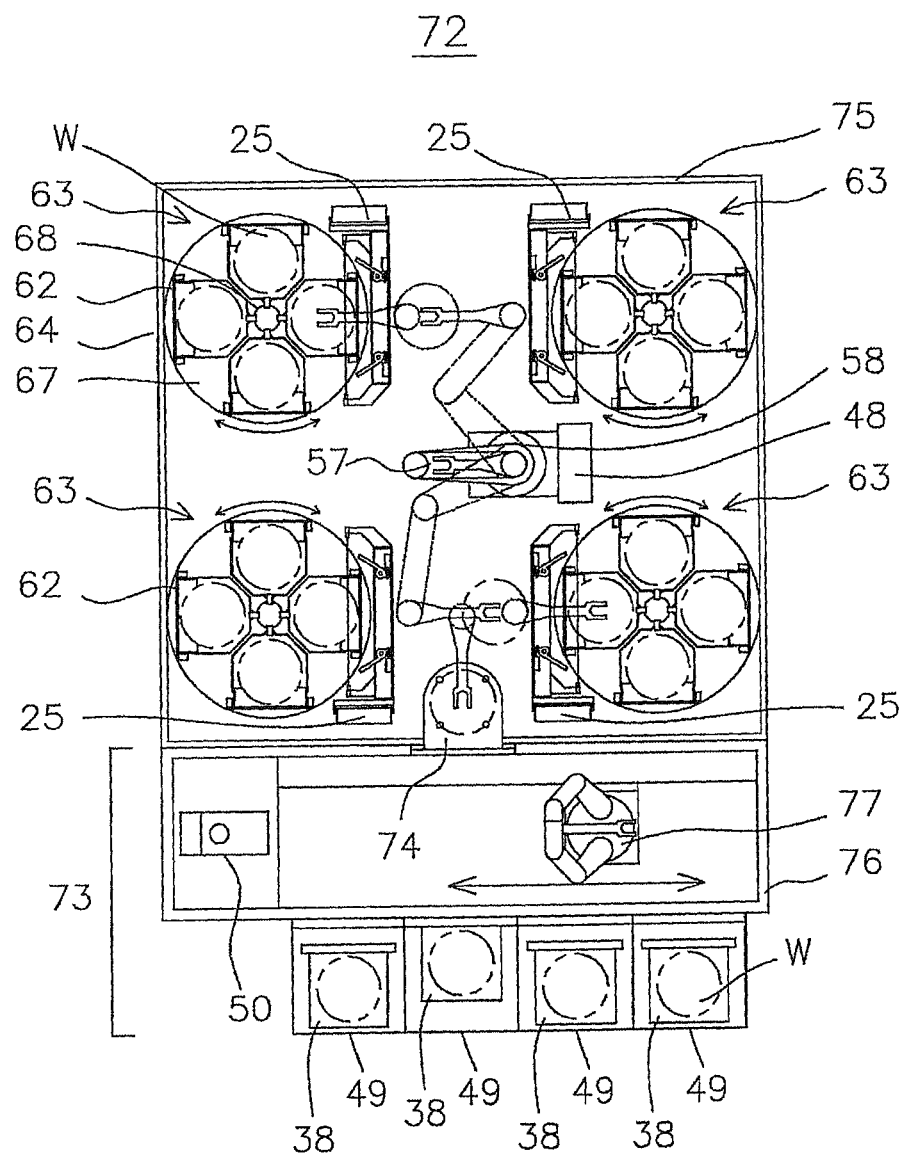
FIG. 12 is a top view illustrating a wafer stocker including a storage unit and a horizontal articulated robot according to another embodiment of the present invention.

Next, a wafer stocker 72 according to a third embodiment of the present invention will be described. FIG. 12 is a view illustrating the wafer stocker 72 of the present embodiment as seen from above. The wafer stocker 72 of the present embodiment includes an EFEM (Equipment Front End Module) 73. The EFEM 73 is a device that conveys the wafer W between the FOUP 38 and a processing device that performs various kinds of processing such as exposure, resist application and etching on the wafer W in a semiconductor manufacturing process. The EFEM 73 includes at least the opener 49, a conveyance robot, and the aligner 50. In addition, in the EFEM 73 installed in the present embodiment, a delivery stand 74 to deliver/receive the wafer W to/from the wafer stocker 72 is disposed on a surface opposite to a surface on which the opener 49 is disposed.

In the wafer stocker 72 of the present embodiment, the wafer conveyance portion 48, on which the above-mentioned horizontal articulated robot 58 is mounted, is disposed near substantially the center, as seen from above, of the internal space formed by a frame 75, a cover, and the FFU 51. In addition, four storage units 63 disclosed in the above-mentioned embodiment are disposed at predetermined intervals around the wafer conveyance portion 48.

The shutter opening/closing units 25 are disposed at positions respectively corresponding to these four storage units 63. The four shutter opening/closing units 25 and the four storage units 63 are disposed in a space where the arm body 57 included in the horizontal articulated robot 58 is operable. With the above configuration, the horizontal articulated robot 58 can convey the wafer W between the delivery stand 74 and each substrate storage container 1 of the storage unit 63.

With the above-mentioned configuration, 16 storage shelves 62 that each can store 100 wafers W can be disposed in the wafer stocker 72 of the present embodiment. Therefore, it becomes possible to store 1600 wafers W in total. In other words, it is possible to store twice as many wafers W as the wafer stocker of the second embodiment. In addition, although the number of wafers W to be stored in the storage shelf 62 is restricted by the installation environment of a semiconductor manufacturing factory where the storage shelf 62 is installed, it is possible to greatly increase the storage number in the entire device by increasing the storage number of the storage shelf 62.

The EFEM 73 included in the present embodiment is formed by a frame 76 different from the frame 75 that forms the wafer stocker 72, and the frame 76 and the frame 75 are mutually coupled by coupling means.

Moreover, the EFEM 73 included in the present embodiment includes four openers 49 along the longitudinal direction of the frame 76, and the wafer W is conveyed between the delivery stand 74 and the FOUP 38 placed on each opener 49 by a handling robot 77 placed inside the frame 76.

Moreover, the EFEM 73 included in the present embodiment includes the FFU 51 on the upper part of the frame 76 and can always maintain the space in the EFEM 73 and the conveyed wafer W at a clean atmosphere.

The wafer stocker 72 of the present embodiment has substantially the same width as the width of a surface of the adjacent EFEM 73 on which the openers 49 are disposed. By making the width of the wafer stocker 72 equal to or smaller than the width of the EFEM 73, for example, it becomes easily possible to leave the EFEM 73 of a certain processing device and replace a system related to other processes and the wafer stocker 72.

Especially in the case of a semiconductor manufacturing factory, operation to enlarge the width occupied by a specific device from an existing layout costs much. Therefore, it is important to maintain the width of the entire device within the width of the existing EFEM 73. The EFEM 73 may have a role as a device called a sorter that switches the FOUP 38 for storage according to the processing condition of the wafer W.

Figure 13:
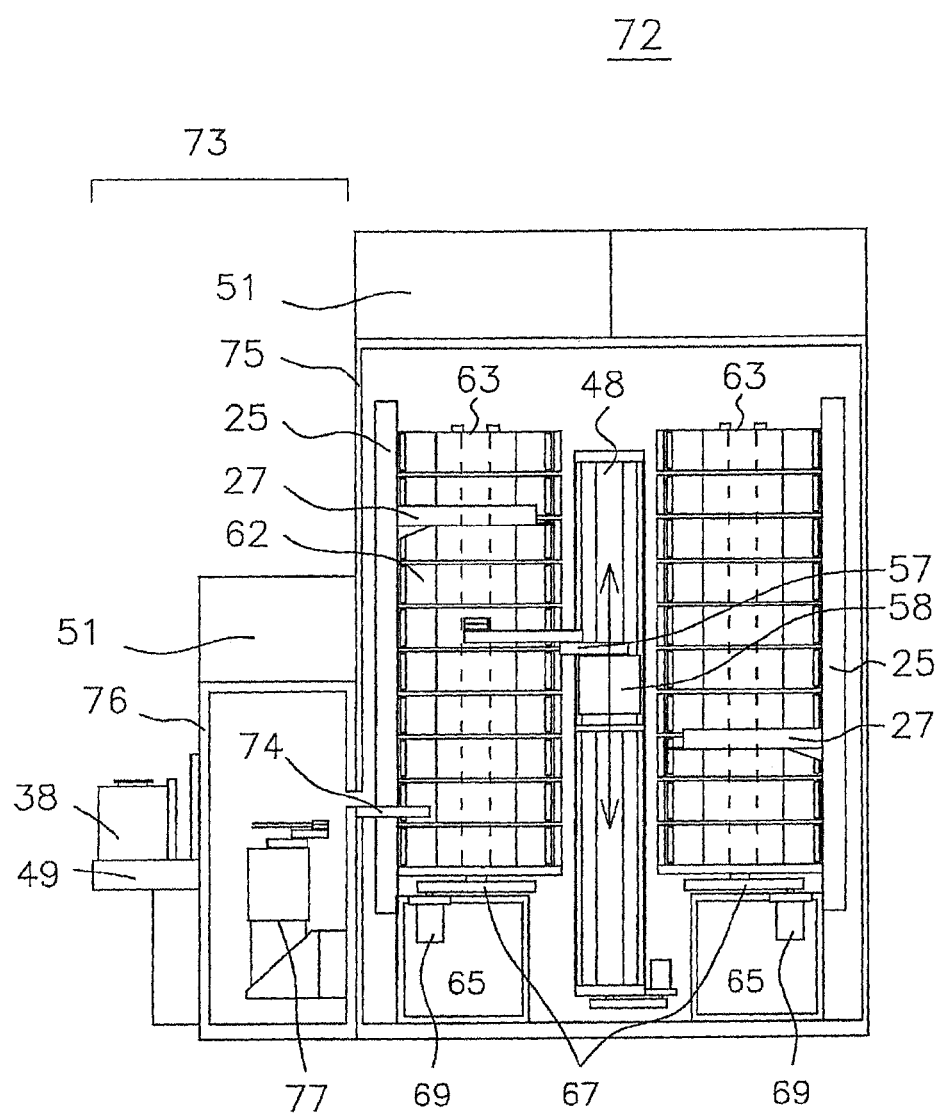
FIG. 13 is a cross-sectional view illustrating a wafer stocker including a storage unit and a horizontal articulated robot according to another embodiment of the present invention.
Figure 14:
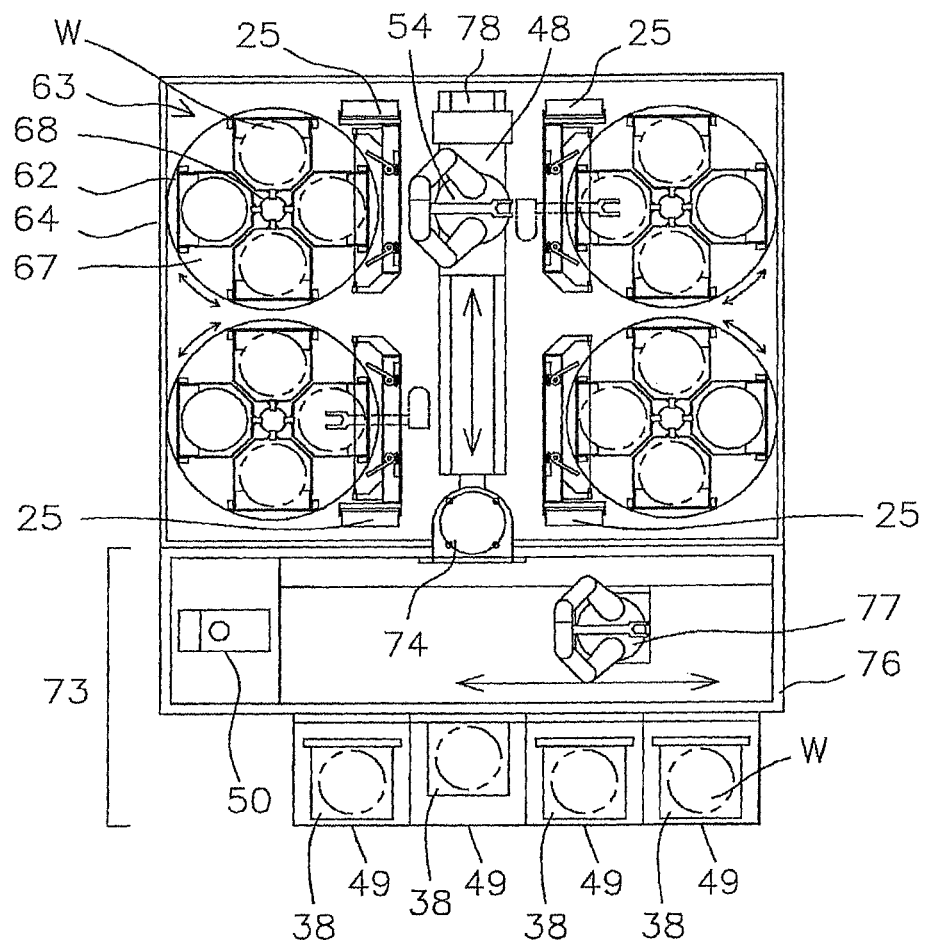
FIG. 14 is a top view illustrating a wafer stocker including a storage unit and an EFEM according to another embodiment of the present invention.

Here, it is assumed that the wafer stocker 72 of the present embodiment includes the horizontal articulated robot 58. Alternatively, however, the wafer stocker 72 may include the wafer conveyance portion 48 including the cylindrical coordinate robot 54 instead of the horizontal articulated robot 58 as illustrated in FIG. 13. That is, it is assumed that the wafer conveyance portion 48 including the cylindrical coordinate robot 54 is disposed in an arm operation region defined by four shutter opening/closing units 25, and there is provided the horizontal movement means 78 for reciprocating this wafer conveyance portion 48 in parallel in a horizontal surface with respect to a direction in which the shutter opening/closing units 25 are disposed. With the above-mentioned configuration, the wafer conveyance portion 48 is not disposed between adjacent shutter opening/closing units 25 in the case of the present embodiment including the horizontal articulated robot 58. Therefore, it is possible to suppress the depth of the wafer stocker 72.

Next, using the substrate storage container 1 of the present invention, test data related to the replacement completion time by the space 19 between the shutter portion S and peripheral members of the shutter portion S such as the cover 9, the upper plate 6, and the lower plate 7 and by the supply amount of nitrogen gas which is clean gas, will be described with reference to a graph.

Figure 15:
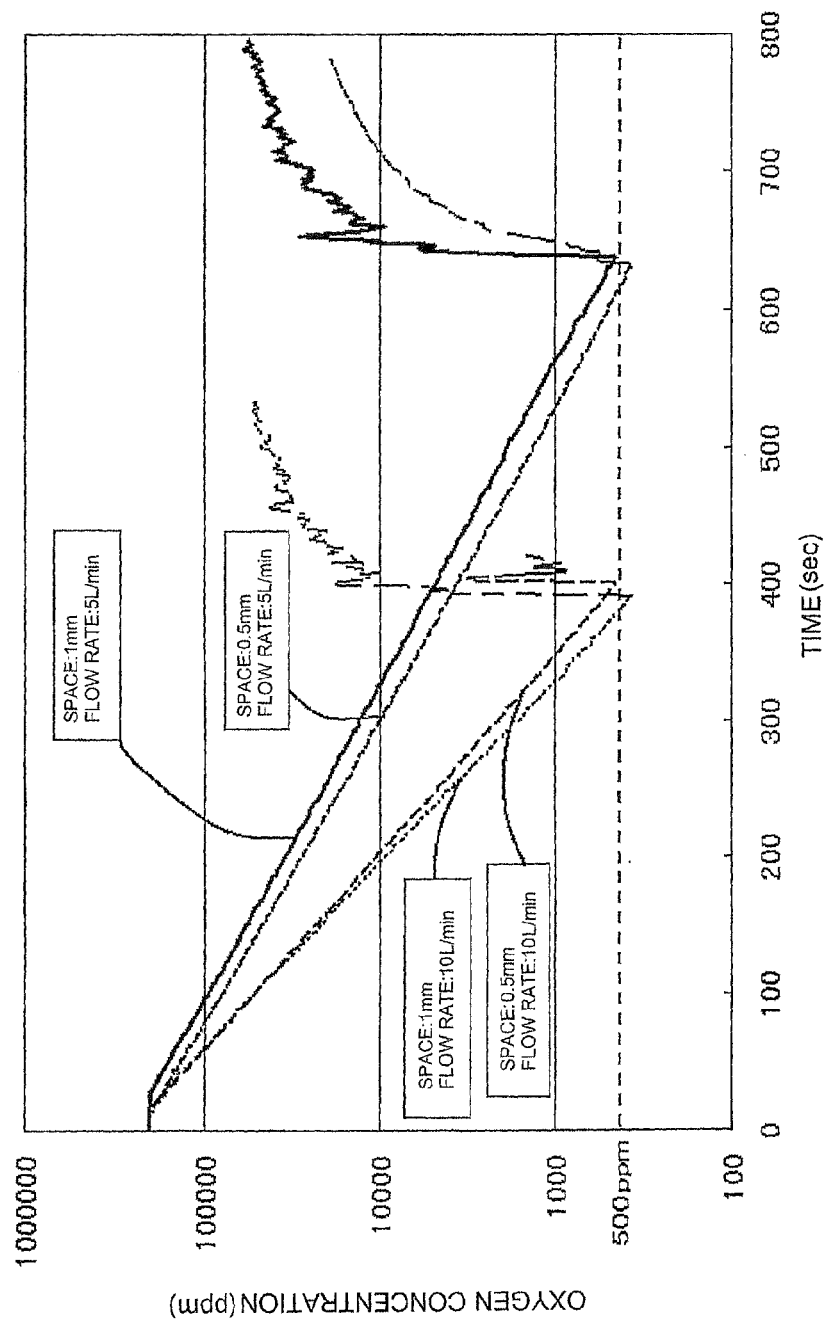
FIG. 15 is a graph of a test related to a space and a supply gas flow rate, which is conducted using the substrate storage container of the present invention.

FIG. 15 is a graph showing measurement of the time to reach a target oxygen concentration, the time varying depending on the width of the space 19 and the flow rate of supply gas. In the graph, there are two conditions as the size of the space 19, i.e., 0.5 mm and 1.0 mm. Also, there are two conditions as the nitrogen supply amount to the substrate storage container 1 having these two spaces, i.e., five liters per minute and ten liters per minute. Under these conditions, the time to reach a predetermined oxygen concentration of 500 ppm was measured. Note that a test was conducted in which the size of the space 19 is 3.0 mm, but the predetermined oxygen concentration was not reached.

In view of the test result, the target oxygen concentration is reached about 20 seconds earlier with the space 19 of 1.0 mm in a case where the nitrogen gas is supplied by ten liters per minute, while the target oxygen concentration is reached about 30 seconds earlier with the space 19 of 0.5 mm in a case where the nitrogen gas is supplied by five liters per minute. It is possible to shorten the time to reach the target concentration when gas of ten liters is continuously supplied. However, taking into account the total consumption amount of gas, it is less effective if the time in the case of supplying ten liters is more than half the time in the case of supplying five liters. In a case of supplying five liters which is a relatively small amount, the time to reach a target oxygen concentration is shorter when the size of the space 19 is 0.5 mm. Taking this into account, from the relationship between the consumption amount of clean gas and the time to reach the target concentration, it is desirable to set the space 19 to 0.5 mm, supply clean gas by ten liters per minute when opening/closing the shutter portion S, and switch the supply amount to five litters per minute after the target concentration is reached.

Figure 16:
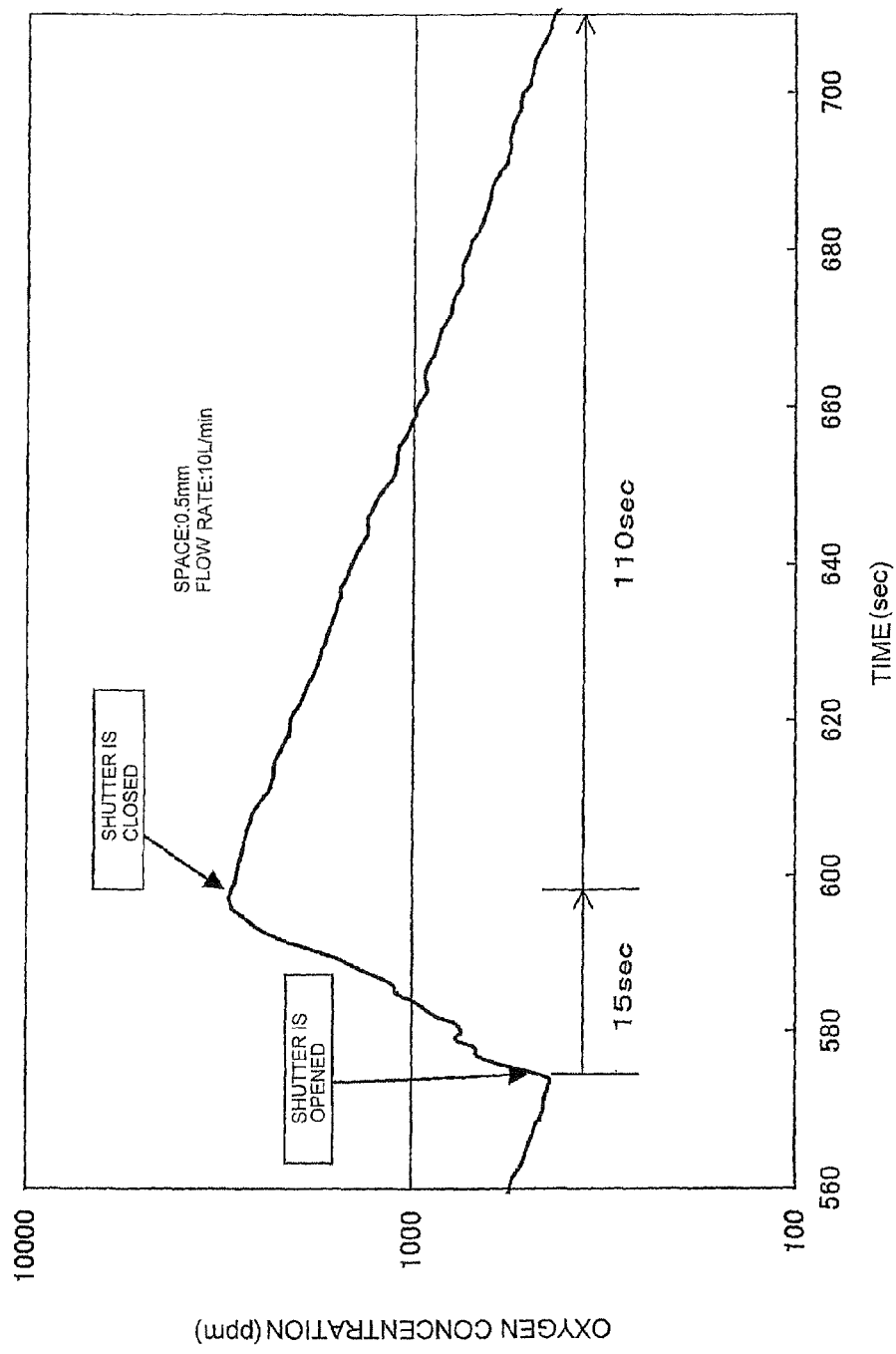
FIG. 16 is a graph of a variation test of an internal atmosphere by shutter opening/closing performed using the substrate storage container of the present invention.

Next, the change in the oxygen concentration in the storage container 1 at the time of opening the shutter portion S when the size of the space 19 is 0.5 mm, and the time to reach an oxygen concentration of 500 ppm after closing the shutter portion S were measured. FIG. 16 is a graph illustrating the test result. The value on the X-axis side shows the passage of time on the second time scale, where 0 is assumed when the supply of nitrogen gas into the storage container 1 starts. In the test, the shutter portion S is opened at an elapsed time of 575 seconds and closed at an elapsed time of 590 seconds. The interval between the opening and closing time is assumed to be 15 seconds because the time required to open and close the shutter portion S and convey the wafer W sequentially is about 15 seconds.

In view of the test result, the oxygen concentration, which is 500 ppm before the shutter portion S is opened, rises only up to 3000 ppm even after the shutter portion S is opened and closed. In the case of an oxygen concentration of 3000 ppm, there is no risk that a pattern formed on the surface of the wafer W reacts with oxygen and forms an oxide film. At this concentration, therefore, it can be said that the wafer W stored in the storage container 1 is not adversely affected even if the shutter portion S is opened and closed.

When nitrogen gas of ten liters per minute continued to be supplied, it was possible to reach an oxygen concentration of 500 ppm in about 110 seconds after the shutter portion S had been closed. In view of this result, the oxygen concentration is not greatly influenced even if the shutter portion S is opened. Therefore, it can be said that it is possible to greatly shorten the time to return to a predetermined oxygen concentration as compared with the above-mentioned test.

The present invention has been described in detail but the present invention is not limited to the disclosed embodiments, and the detailed structure in each embodiment can be appropriately changed by those skilled in the art without departing from the scope of the present invention described in claims. For example, to change an object to be stored from the wafer W into a liquid crystal glass substrate or a tabular member such as a reticle and a mask is a matter that can be appropriately designed, and it is possible to appropriately select the material and shape, for example, of each part according to necessary conditions.

REFERENCE SIGNS LIST

1 Substrate storage container
2 Substrate
3 Shelf plate
4 Spacer
5 Wafer support portion
6 Upper plate
7 Lower plate
8 Assembly
9 Cover
10 Body opening portion
11 Nozzle
11a Introduction tube
11b Ejection port
11c Diffusion suppression member
15 Shield plate
18 Positioning shaft (position restriction member)
20 Positioning member
21 Positioning pin
23 Positioning block
24 Finger
25 Shutter opening/closing unit
26 Hook
27 Shutter support mechanism
28 Lift drive portion
46 Wafer stocker of first embodiment
48 Wafer conveyance portion
49 Opener
50 Aligner
54 Cylindrical coordinate robot
56 Wafer stocker of second embodiment
63 Storage unit
72 Wafer stocker of third embodiment
80 Support controlling means
81 Stocker control portion
S Shutter portion

The invention claimed is:

1. A storage container comprising:
a body portion that has multiple shelf plates, each having an opening portion in one surface thereof and being disposed at a regular interval in a vertical direction so as to support a tabular object to be stored thereon, a spacer that is disposed between the multiple shelf plates and maintains the interval between the shelf plates vertically adjacent to each other, and a nozzle to supply clean gas internally;
a cover member that covers a side surface, a top surface and a bottom surface other than the opening portion of the body portion; and
a shutter portion that has multiple shield plates arranged to cover the opening portions corresponding to the multiple shelf plates, and moving up and down separately from the shelf plates to access the objects supported and stored on the shelf plates,
wherein the shutter portion is disposed apart from the body portion to form a minute space therebetween so as to flow out the gas supplied from the nozzle to the outside by a proper quantity while maintaining an inner pressure of the body portion, and
the shield plates are accumulated to contact each other and disposed to be vertically moved individually.

2. The storage container according to claim 1, wherein the shelf plates are disposed at the intervals through which a robot finger accesses and holds the object to be stored on each of the shelf plates.

3. The storage container according to claim 1, wherein each of the shield plates of the shutter portion has a height equal to the interval between the shelf plates.

4. The storage container according to claim 1, further comprising a position restriction member fixing the shield plates movably thereto,
wherein each of the shield plates of the shutter portion is vertically moved in a surface restricted by the position restriction member.

5. The storage container according to claim 1, wherein the body portion includes a detection window configured to transmit light emitted from an optical sensor that detects presence of the object to be stored supported on the shelf plate.

6. The storage container according to claim 1, wherein a flow rate of the gas supplied from the nozzle into the body portion is switched between when each of the shield plates is opened and when each of the shield plates is closed.

7. The storage container according to claim 1, wherein a space between the shutter portion and the body portion forms a labyrinthine structure.

8. The storage container according to claim 1, wherein the cover member has positioning members formed on an upper surface and a lower surface thereof such that the storage containers are accumulated and disposed in a vertical direction.

9. A shutter opening/closing unit that opens and closes the shutter portion included in the storage container according to claim 1, wherein the shutter opening/closing unit comprises:
a hook engaging a notch portion formed in the shield plate;
a shutter support mechanism; and
a lift drive portion that moves up and down the shutter support mechanism in parallel to a direction in which the storage containers are accumulated.

10. The shutter opening/closing unit according to claim 9, wherein the shutter support mechanism includes an optical sensor having a light projecting portion and a light receiving portion.

11. A wafer stocker comprising:
a clean booth;
an FOUP opener joined to an outer surface of the clean booth;
at least two storage containers according to claim 1, vertically accumulated and disposed in the clean booth;
the shutter opening/closing unit comprising,
a hook engaging a notch portion formed in the shield plate,
a shutter support mechanism, and
a lift drive portion that moves up and down the shutter support mechanism in parallel to a direction in which the storage container is accumulated;
a wafer conveyance portion that conveys a wafer between the FOUP and the storage container; and
a stocker control portion.

12. The wafer stocker according to claim 11, wherein the stocker control portion has a function to adjust a flow rate of gas supplied into the storage container according to operation of opening and closing the shutter portion by the shutter opening/closing unit.

13. The wafer stocker according to claim 11, further comprising:
a storage shelf formed by accumulating the storage containers in a vertical direction;
a storage unit in which multiple storage shelves are disposed at equal intervals; and
a rotation drive portion that rotates and operates the storage unit;
wherein the shutter opening/closing unit disposed in a position adjacent to the storage unit; and
the wafer conveyance portion that conveys the wafer between the FOUP and the storage container.

14. The wafer stocker according to claim 13, wherein the storage unit includes a round placement table on which the multiple storage shelves are placed at equal intervals.

15. The storage container according to claim 4, wherein the cover member includes an upper plate covering the top surface of the body portion, an lower plate covering the bottom surface of the body portion and a cover covering the side surface of the body portion;
the position restriction member includes two positioning shafts, each connecting the upper plate and the lower plate;
each of the shield plates includes through holes at two ends thereof, the two positioning shafts being respectively inserted in the through holes formed at the two ends such that the shield plates are slidably fixed to the position restriction member; and
the shield plates are arranged such that when a hook is engaged to one shield plate and moved upwardly to access the object to be conveyed outside, the one shield plate is moved upwardly integrally with the shield plates arranged above the one shield plate to form an opening between the shield plates moving upwardly and the shield plates arranged below the one shield plate.

16. The storage container according to claim 15, wherein each of the shield plates has an elongated portion and side portions to form a substantially U-shape, and the cover is arranged apart from the elongated portion inside the side portions to form the minute space in which the gas supplied from the nozzle is meandered to discharge outside.

17. A wafer stocker comprising:
the storage container according to claim 15, and
a shutter opening/closing unit that opens and closes the shutter portion included in the storage container, the shutter opening/closing unit including a hook engaged to the shield plate.

* * * * *